(12) United States Patent
Yang et al.

(10) Patent No.: US 7,977,171 B2
(45) Date of Patent: Jul. 12, 2011

(54) METHOD FOR FABRICATING THIN FILM TRANSISTOR SUBSTRATE

(75) Inventors: Joon Young Yang, Gyeonggi-do (KR); Young Kwon Kang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 246 days.

(21) Appl. No.: 11/808,979

(22) Filed: Jun. 14, 2007

(65) Prior Publication Data

US 2008/0003723 A1 Jan. 3, 2008

(30) Foreign Application Priority Data

Jun. 28, 2006 (KR) .................. 10-2006-0058944

(51) Int. Cl.
*H01L 21/84* (2006.01)
(52) U.S. Cl. .......... 438/151; 438/157; 438/158; 438/30; 257/72
(58) Field of Classification Search ............ 257/72, 257/290, E29.117; 438/30, 149, 151, 157, 438/158

See application file for complete search history.

(56) References Cited

U.S. PATENT DOCUMENTS

2003/0076452 A1* 4/2003 Kim et al. .................. 349/43
2007/0058116 A1* 3/2007 Lee et al. .................. 349/114

* cited by examiner

*Primary Examiner* — Thanh V Pham
*Assistant Examiner* — Maria Ligai
(74) *Attorney, Agent, or Firm* — Morgan, Lewis & Bockius LLP

(57) ABSTRACT

A method of fabricating a thin film transistor substrate for reducing a mask process and, at the same time removing a transparent electrode ITO which remains at a non-display area by a contact hole filling process is disclosed. In the method of fabricating the thin film transistor substrate having a display area and a non-display area, a gate pattern is formed at the exterior of the display area. A gate insulating film is formed on a substrate provided with a gate pattern, and then a data pattern is formed. And a protective film is formed on an entire substrate provided with a data pattern, and then a conductive pattern, and then a conductive pattern, which is comprised of a pixel electrode which is formed at a display area, and a lower gate pad electrode and a lower data pad electrode which are formed at a non-display area, is formed.

10 Claims, 27 Drawing Sheets

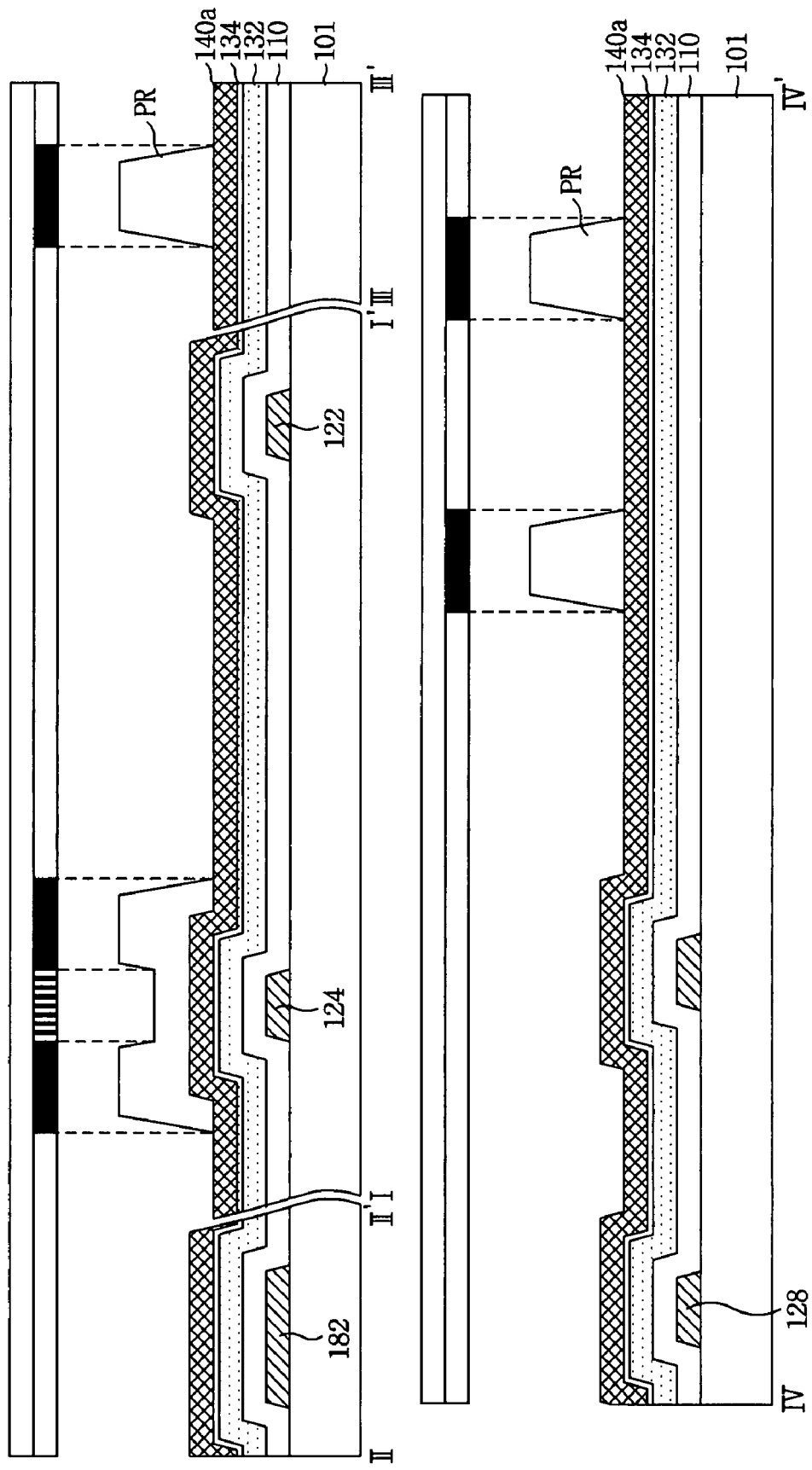

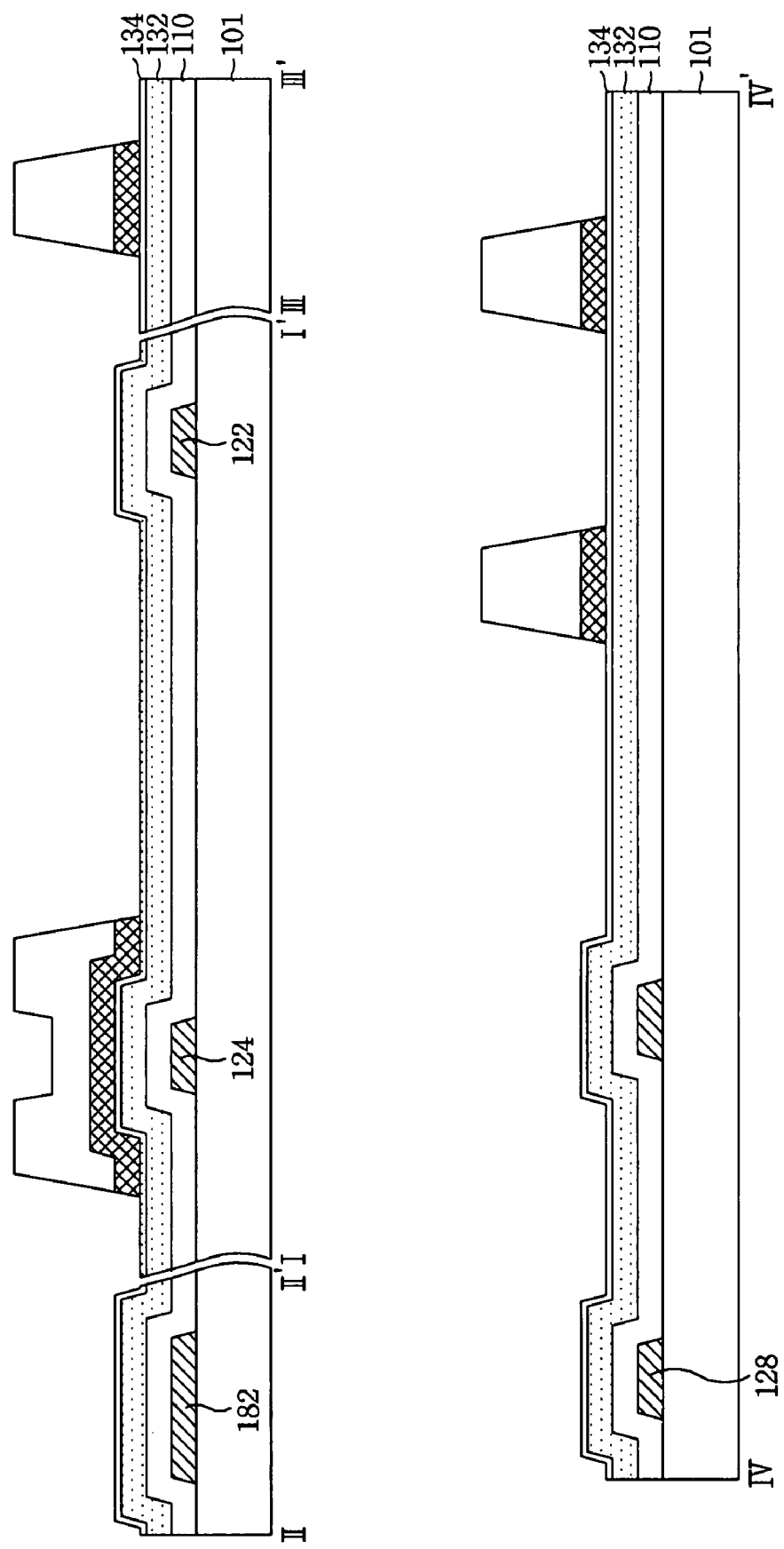

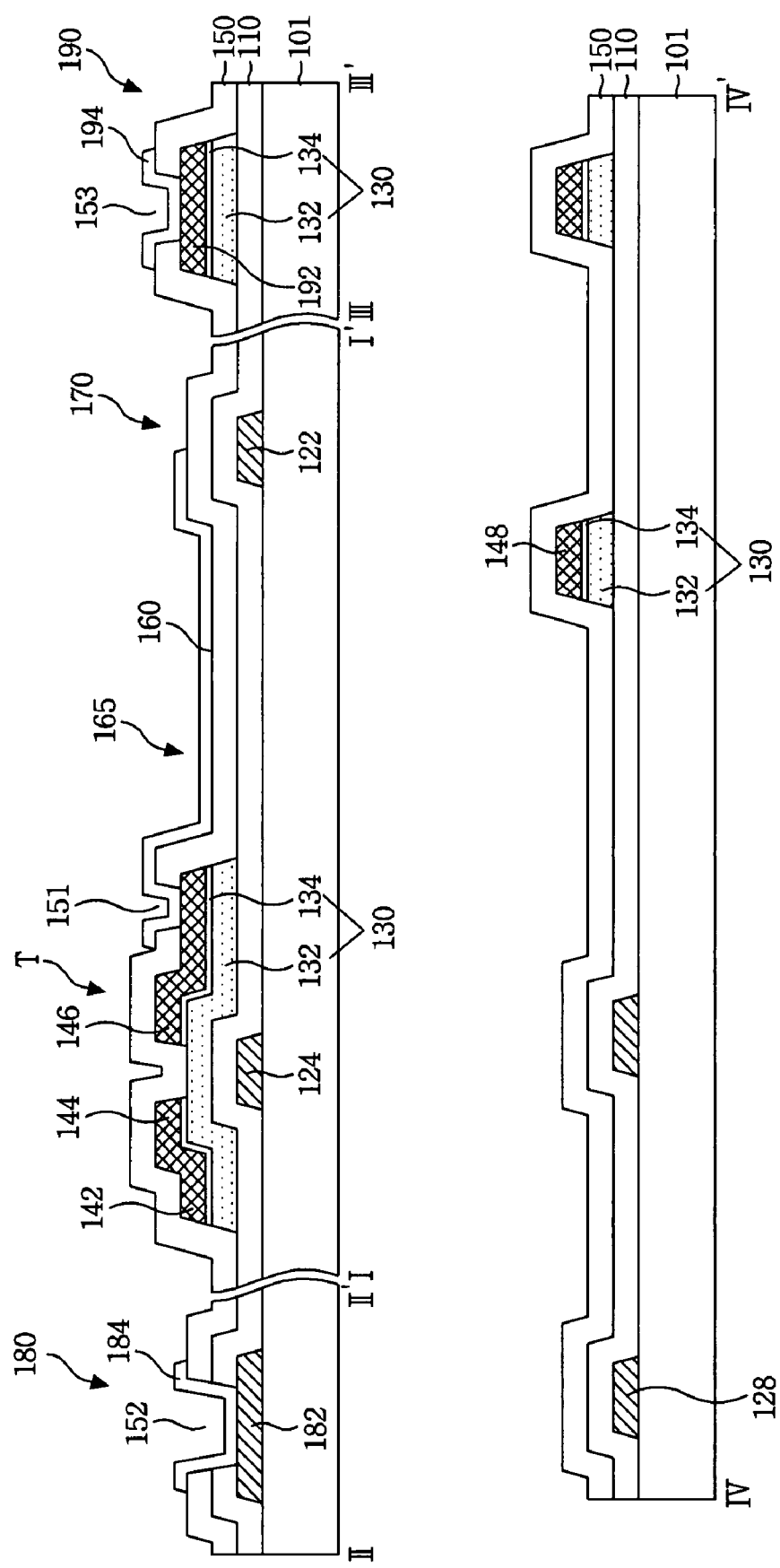

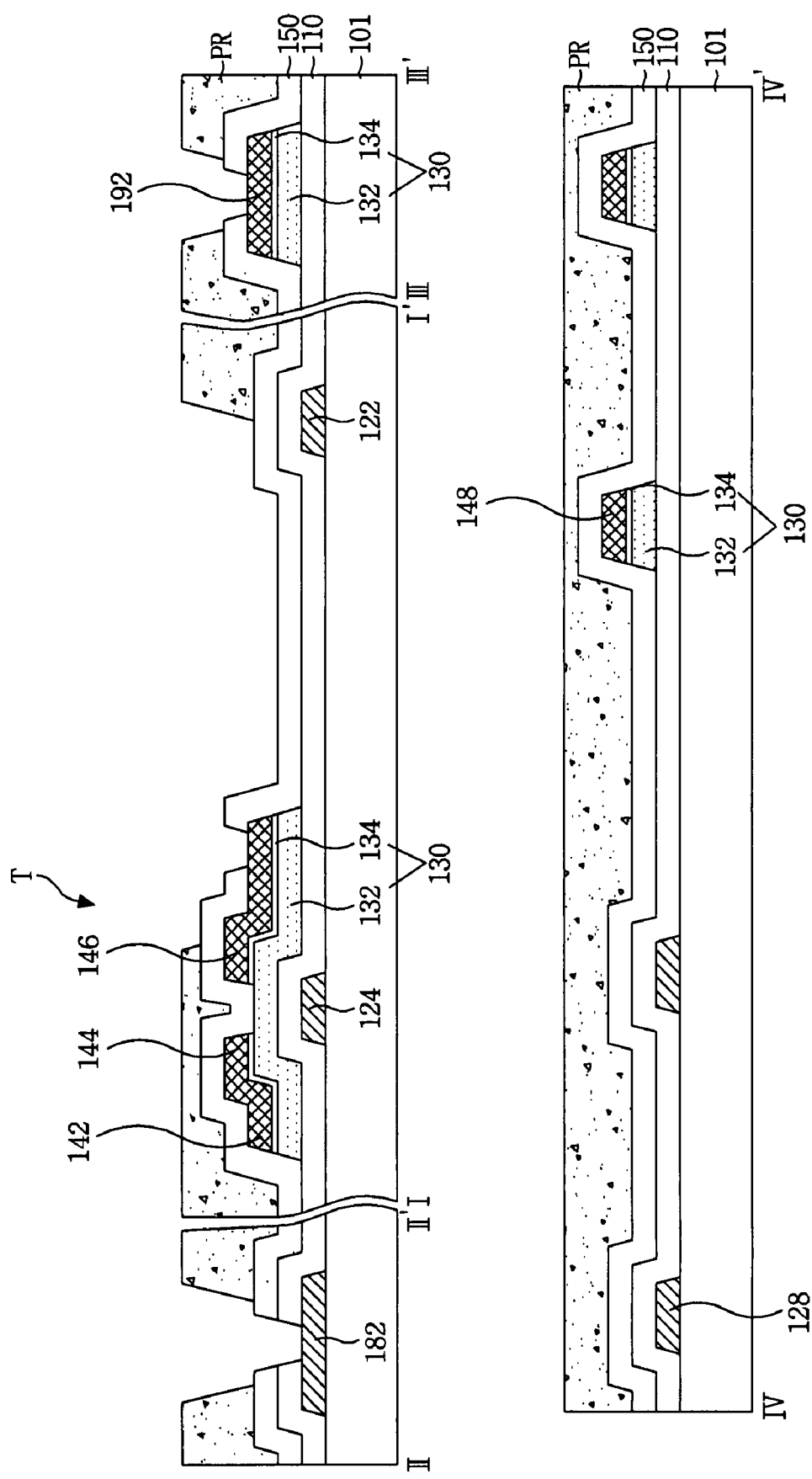

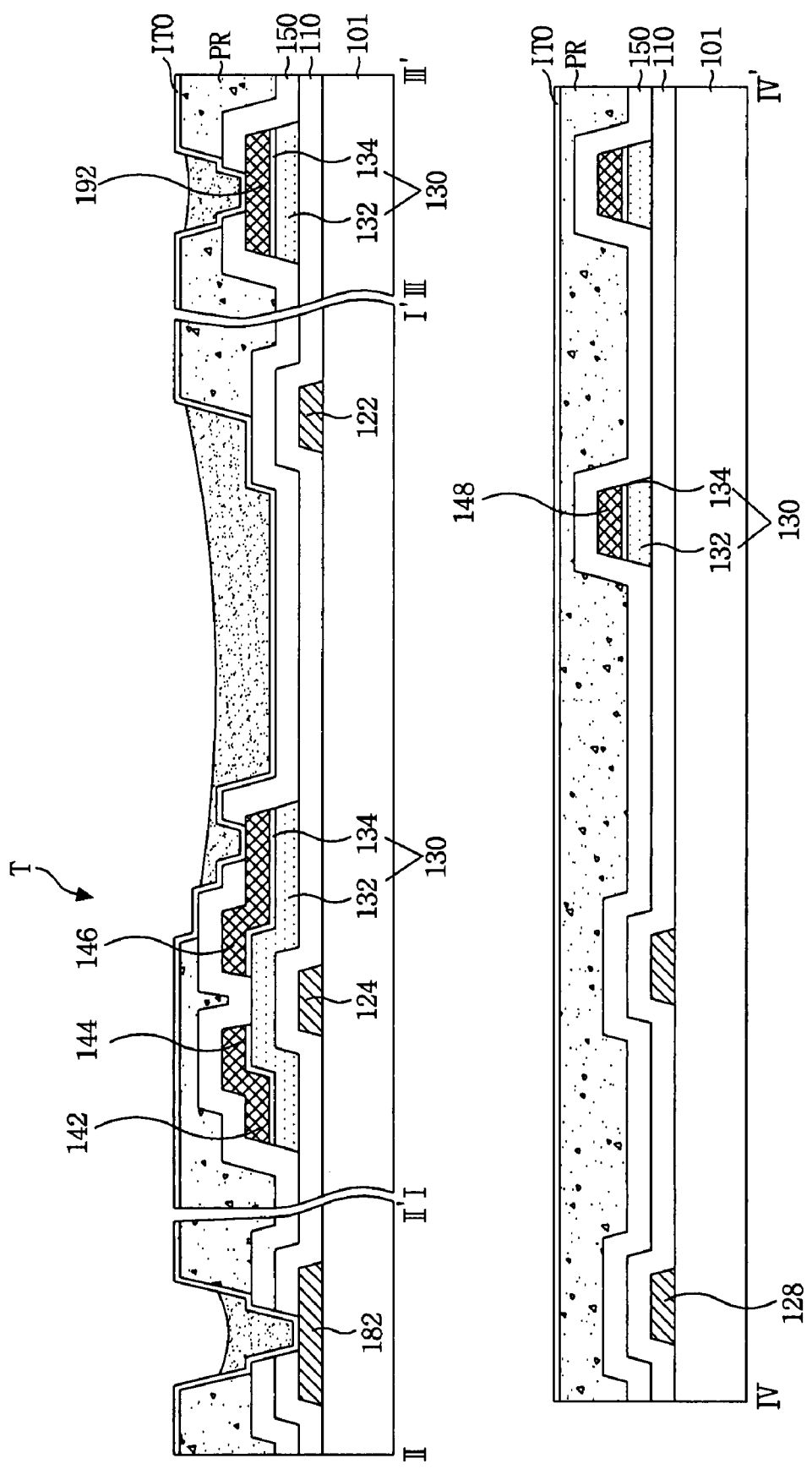

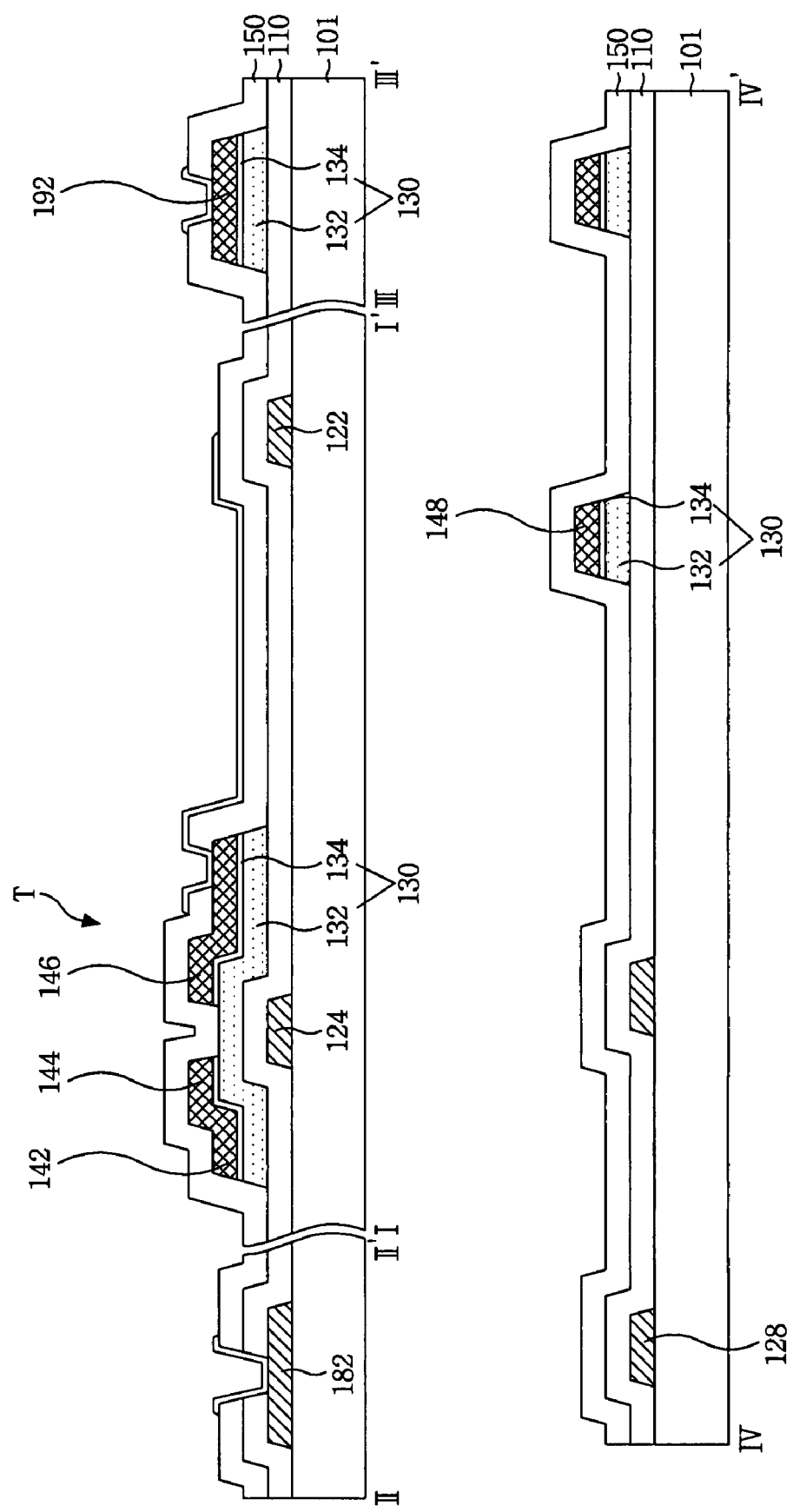

METHOD FOR FABRICATING THIN FILM TRANSISTOR SUBSTRATE

This application claims the benefit of Korean Patent Application No. 10-2006-058944 filed in Korea on Jun. 28, 2006, which is hereby incorporated by reference in its entirety.

BACKGROUND OF THE INVENTION

1. Field of the Invention

The present invention relates to a method of fabricating a thin film transistor substrate, and more particularly to a method of fabricating a thin film transistor substrate that is adaptive for removing a transparent electrode which remains at a non-display area using a contact hole filling process.

2. Description of the Related Art

An image display device has become very important as a visual information communicating media in information society.

A Cathode Ray Tube (CRT), which has been a main stream of the image display device, has problems of heavy weight and bulky volume. There have been developed various flat panel display devices reduced in weight and bulk that is capable of eliminating disadvantages of the cathode ray tube (CRT).

Flat panel display devices include a liquid crystal display device (hereinafter, referred to as "LCD"), a field emission display device (hereinafter, referred to as "FED"), a plasma display panel (hereinafter, referred to as "PDP"), and an electro-luminescence (hereinafter, referred to as "EL"), etc., and most of these flat panel display devices are put to practical use having significant market share in the display device market.

Since the liquid crystal display device satisfies thin profile and light weight of electronics and productivity of the liquid crystal display device is improved, the cathode ray tube has rapidly been replaced with the liquid crystal display device in many application areas.

A liquid crystal display device of active matrix type that drives a liquid crystal cell using a thin film transistor (hereinafter, referred to as "TFT") has an advantage of an excellent picture quality and a low power consumption, and has been rapidly developed toward a large-dimension screen and a high-resolution by a recent mass-producing technique and the result of a research and development.

A configuration and an operation of the above-mentioned liquid crystal display will be described with reference to FIG. 1 as follows.

A liquid crystal display controls a light transmittance of a liquid crystal using an electric field to display an image. The liquid crystal display includes a thin film transistor, a color filter substrate, a spacer, which is located between two substrates to constantly maintain a cell gap, and a liquid crystal which is filled into the cell gap as shown in FIG. 1.

Herein, a thin film transistor substrate 70 is comprised of a gate line 71 and a data line 72 which are crossed each other, a thin film transistor 73 which is formed at a crossing part of the gate line 71 and the data line 72, a pixel electrode 74 which is connected to the thin film transistor 73, and a lower alignment film (not shown) that aligns a liquid crystal.

In this case, the thin film transistor 73 is comprised of a semiconductor layer that forms a source electrode which is connected to the data line 72, a drain electrode which is opposed to a source electrode with having a channel therebetween, and a channel. Herein, the semiconductor layer includes an active layer that forms a channel between a source electrode and a drain electrode, and an ohmic contact layer which is located on the active layer to make an ohmic contact with a source electrode and a drain electrode.

The color filter substrate 80 is comprised of a black matrix 81 that prevents a light leakage, a color filter 82 that realizes a color, a common electrode 83 that forms a vertical electric field with the pixel electrode 74, and an upper alignment film 84 that is coated for aligning a liquid crystal.

As described above, the thin film transistor substrate is manufactured by a standard mask process, that is, a five mask process or a four mask process, and each mask process is comprised of a lot of processes such as thin film deposition (coating), cleaning, photolithography, etching, photo-resist stripping and inspection processes, etc.

Accordingly, the thin film transistor substrate requires a plurality of mask processes, so that a manufacturing process is complicated, and a manufacturing cost is increased.

SUMMARY OF THE INVENTION

Accordingly, it is an object of the present invention to provide a method of fabricating a thin film transistor substrate that is adaptive for reducing a mask process through a contact hole filling process.

It is another object of the present invention to provide a thin film transistor substrate that is adaptive for carrying out a contact hole filling process to remove a transparent electrode which remains at a non-display area, and a fabricating method thereof.

In order to achieve these and other objects of the invention, a method of fabricating a thin film transistor substrate, including a display area where has liquid crystal cells which are arranged in a matrix type, and a non-display area where is located at an exterior of the display area, according to the present invention comprises forming a gate pattern that is comprised of a gate line which is formed at a display area, a gate electrode which is connected to a gate line, a gate link which is formed at a non-display area, and a lower gate pad electrode which is connected, via a gate link, to a gate line; forming a gate insulating film on a substrate provided with a gate pattern, and then forming a data pattern that is comprised of a data line which is formed at a display area and is crossed with a gate line, a source electrode and a drain electrode which are connected to a data line, a data link which is formed at a non-display area, and a lower data pad electrode which is connected, via a data link, to a data line; and forming a protective film on an entire substrate provided with a data pattern, and then forming a conductive pattern that is comprised of a pixel electrode which is formed at a display area by a contact hole filling process using a smoothing material, and a lower gate pad electrode and a lower data pad electrode which are formed at a non-display area.

The method of fabricating the thin film transistor substrate according to the present invention further includes forming a storage capacitor that is comprised of a gate line and the pixel electrode which is formed to be overlapped with the gate line with having a gate insulating film and a protective film between.

In the method, the step of forming the gate pattern includes forming a gate metal layer on a substrate of the display area and the non-display area; forming a photo-resist on the entire gate metal layer, and then forming a photo-resist pattern that exposes the gate metal layer by a first mask process; etching a gate metal layer which is exposed by the photo-resist pattern to form the gate pattern; and removing a photo-resist pattern which remains on the substrate by a stripping process.

In the method, the step of forming the data pattern includes sequentially forming a gate insulating film that covers the gate pattern, a semiconductor layer that forms a channel, and a data metal layer on a substrate of the display area and the non-display area; forming a photo-resist on the entire data metal layer, and then forming a photo-resist pattern having step coverage at a channel area by a second mask process; etching the data metal layer which is exposed by the photo-resist pattern, and then ashing the photo-resist pattern to expose a data metal layer which is formed at the channel area; etching a data metal layer which is exposed at the channel area to form the data pattern, and then etching a semiconductor layer which is exposed at the channel area to form a semiconductor pattern which is comprised of an active layer and an ohmic contact layer; and removing a photo-resist pattern which remains on the substrate by a stripping process.

In the method, the second mask a half tone mask where a diffractive pattern is formed to correspond to the channel area.

In the method, the step of the conductive pattern includes forming a protective film on an entire gate insulating film of the display area and the non-display area, and then forming a photo-resist pattern that exposes the protective film by a third mask process; etching the protective film which is exposed by the photo-resist pattern to form a plurality of contact holes; ashing a photo-resist pattern provided with the contact hole to remove a photo-resist pattern which is formed at a pixel area; forming a transparent conductive film on the entire ashed photo-resist pattern, and then covering a photo-resist pattern provided with the transparent conductive film with a smoothing material; ashing a smoothing material which covers the display area and the non-display area to expose a transparent conductive film which is formed at another area other than an area to be formed the conductive pattern; etching a transparent conductive film which is exposed at the display area and the non-display area to form the conductive pattern; and removing a photo-resist pattern and a smoothing material which remain on the substrate by a stripping process.

In the method, the step of forming a contact hole on the protective film includes forming a first contact hole that passes through the protective film to expose the drain electrode; forming a second contact hole that passes through the protective film and a gate insulating film to expose the lower gate pad electrode; and forming a third contact hole that passes through the protective film to expose the lower data pad electrode.

In the method, the third mask a half tone mask where a diffractive pattern is formed to correspond to a pixel area where the pixel electrode is formed.

In the method, a transparent conductive film, which is formed at the non-display area, is all exposed in the step of exposing the transparent conductive layer.

In the method, a transparent conductive film, which is exposed at the non-display area, is all etched, so that a transparent conductive film does not remain at the non-display area in the step of etching the exposed transparent conductive film.

Herein, a smoothing material which is used upon a contact hole filling process according to the present invention is an over-coat layer.

BRIEF DESCRIPTION OF THE DRAWINGS

These and other objects of the invention will be apparent from the following detailed description of the embodiments of the present invention with reference to the accompanying drawings, in which:

FIG. 7A to FIG. 7H are flow charts showing a process of forming a data pattern according to the present invention;

FIG. 8A and FIG. 8B are a plan view and a sectional view showing the thin film transistor substrate provided with a gate pattern by a third mask process according to the present invention; and FIG. 9A to FIG. 9I are flow charts showing a process of forming a conductive pattern according to the present invention.

DETAILED DESCRIPTION OF THE PREFERRED EMBODIMENT

Hereinafter, the preferred embodiments of the present invention will be described in detail with reference to the accompanying drawings.

First, a configuration of the thin film transistor substrate which is divided into a display area A and a non-display area B according to the present invention will be described with reference to FIG. 2.

Figure 1:
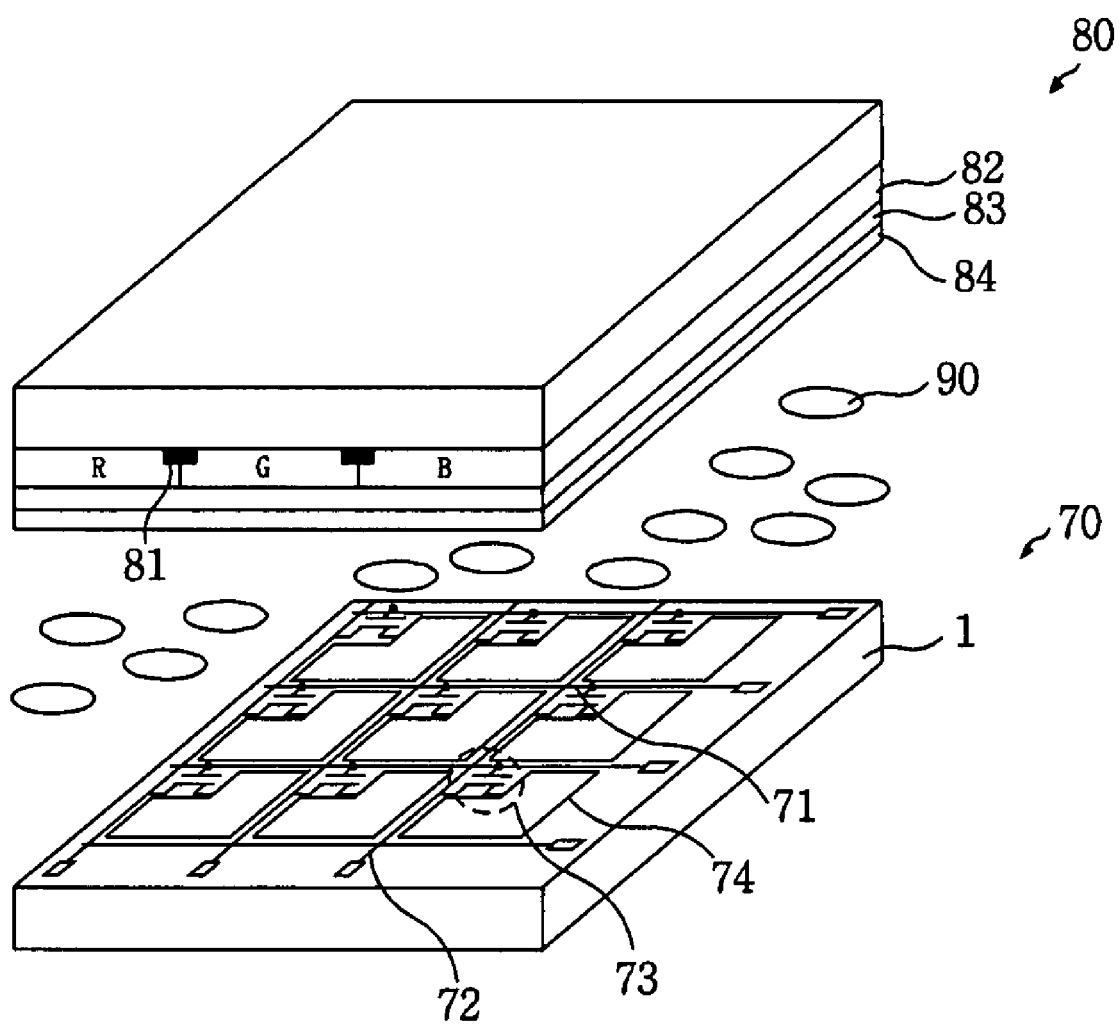
FIG. 1 is a perspective view showing a liquid crystal display to which the present invention is applied.
Figure 2:
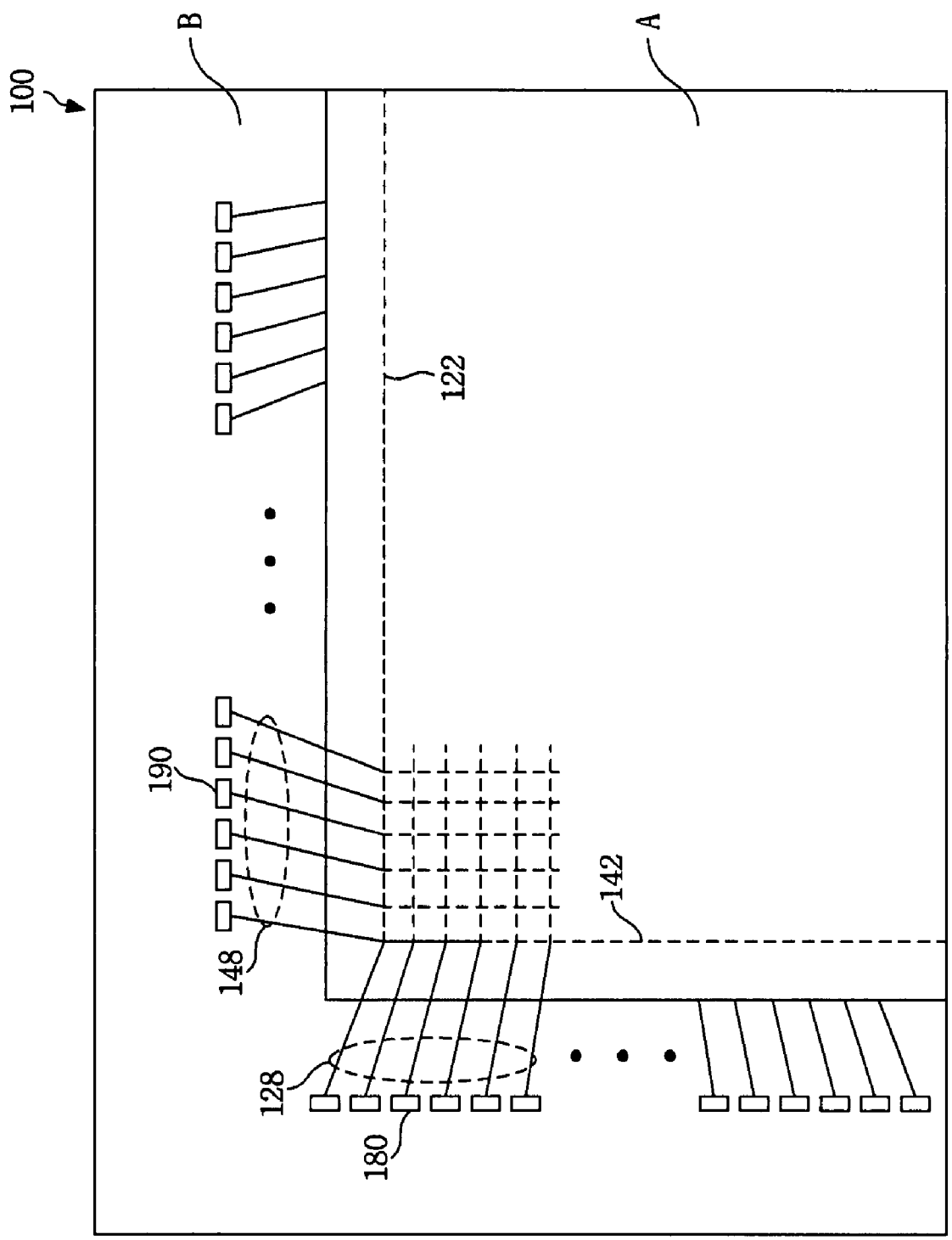
FIG. 2 is a diagram showing a configuration of a thin film transistor substrate which is divided into a display area and a non-display area according to the present invention.

Referring to FIG. 2, a thin film transistor substrate 100 according to the present invention is comprised of a display area A having liquid crystal cells, which are arranged in a matrix type, and a non-display area B other than the display area A.

Figure 3:
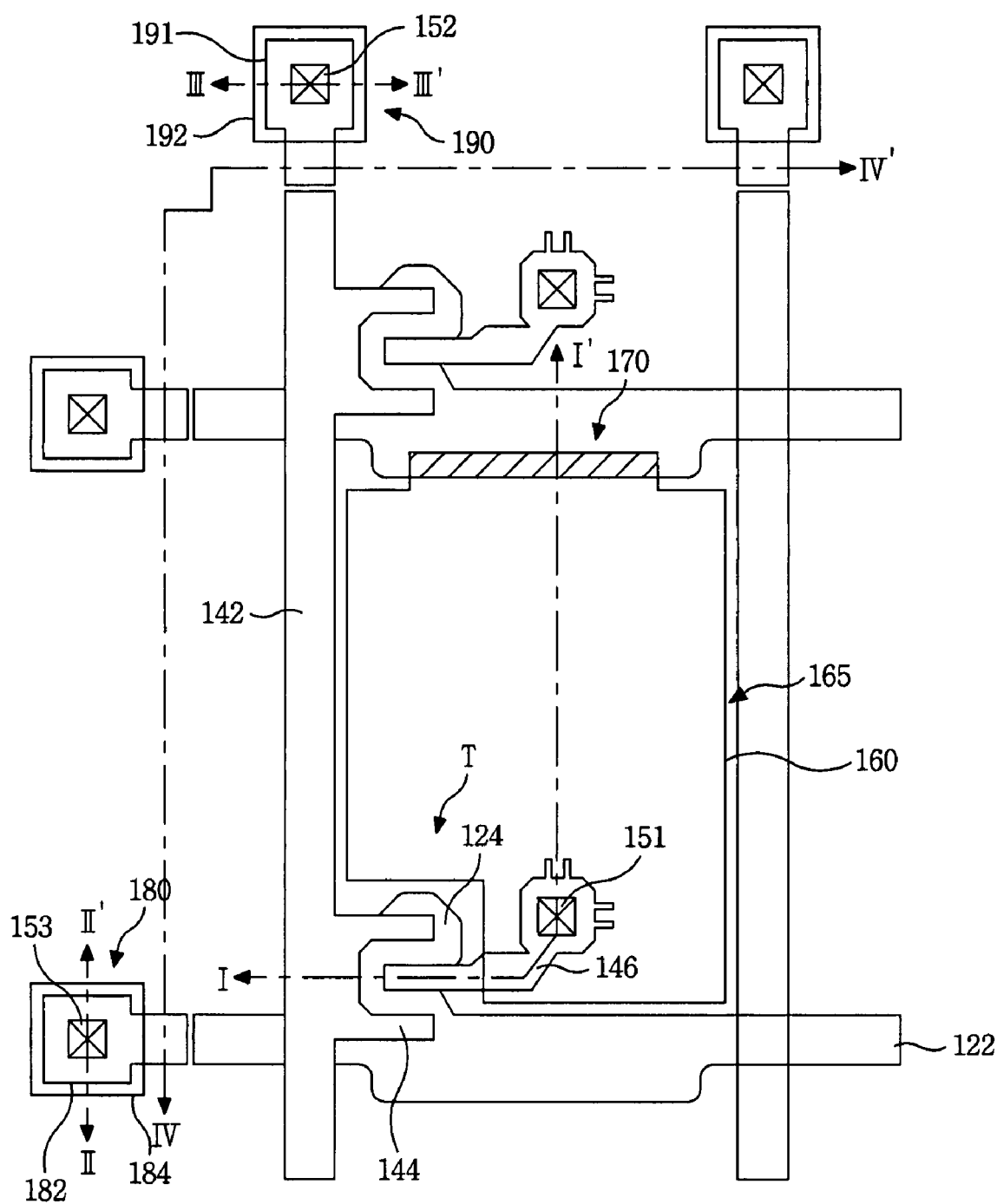
FIG. 3 is a plan view showing the thin film transistor substrate according to the present invention.
Figure 4:
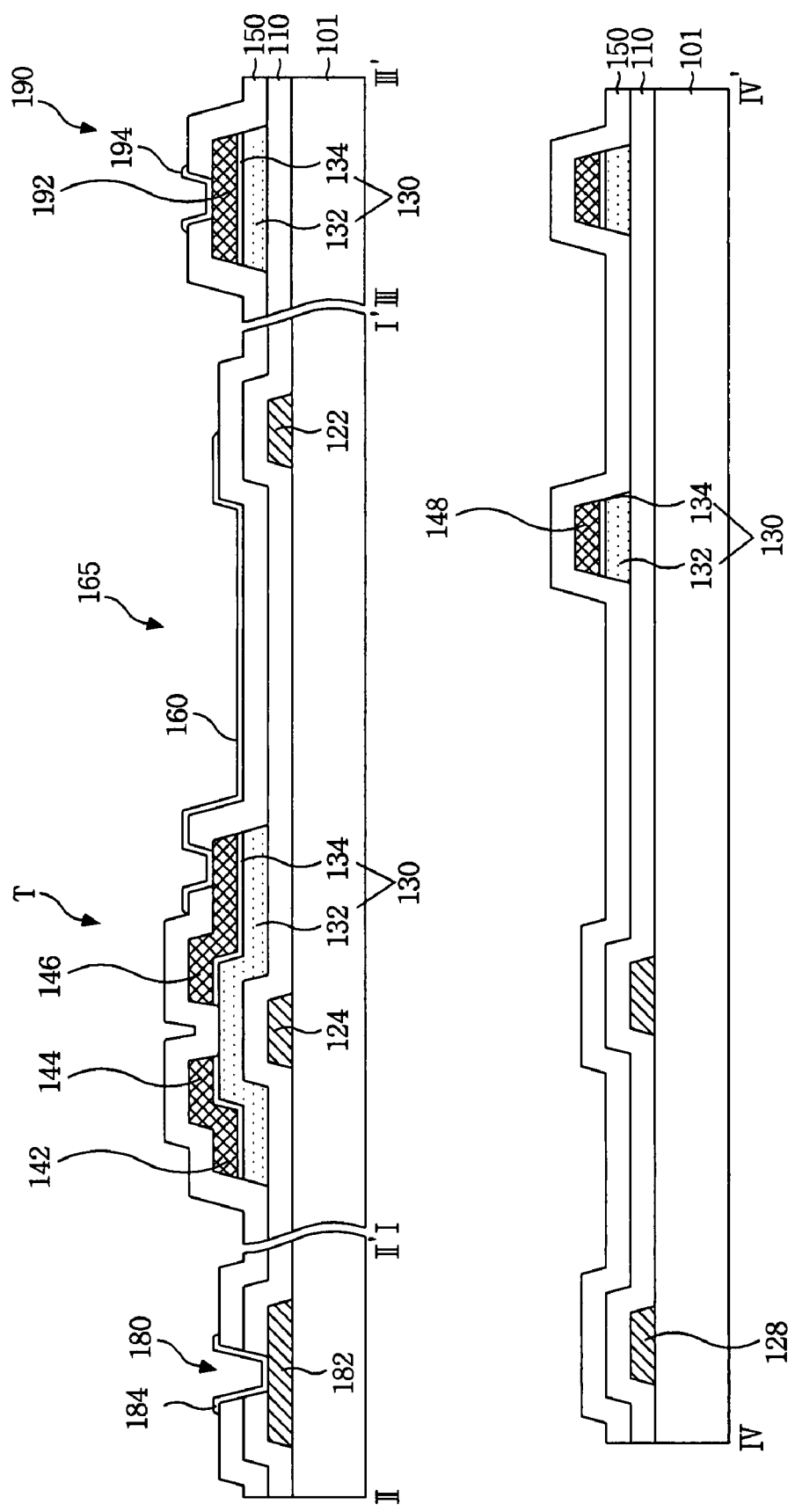
FIG. 4 is a sectional view of the thin film transistor substrate taken along the I-I', II-II', III-III', and IV-IV' lines in FIG. 3.

Herein, a gate line 122, a data line 142, a thin film transistor T, a protective film 150, a pixel electrode 160, and a storage capacitor 170, etc are formed at the display area A of the thin film transistor substrate 100 as shown in FIG. 3 and FIG. 4. Herein, the gate line 122 is formed on a substrate 101. The data line 142 is crossed with the gate line 122 with having a gate insulating film 110 therebetween to define a pixel area. The thin film transistor T is formed for each intersection of the gate line 122 and the data line 142. The protective film 150 covers a thin film transistor which is formed on the gate insulating film 110. The pixel electrode 160 passes through the protective film 150 to be connected to the thin film transistor T. The storage capacitor 170 is formed at an overlapping part of the gate line 122 and the pixel electrode 160.

Furthermore, a gate pad 180, a gate link 128, a data pad 190, and a data link 148, etc are formed at the non-display area B of the thin film transistor substrate 100 as shown in FIG. 3 and FIG. 4. Herein, the gate pad 180 supplies a gate signal. The gate link transmits a gate signal, which is supplied from the gate pad 180, to the gate line 122. The data pad 190 supplies a data signal. The data link 148 transmits a data signal, which is supplied from the data pad 190, to the data line 142. Furthermore, a signal line group of LOG type (not shown), which transmits gate driving signals with which a gate drive IC is supplied, is located at an exterior of the non-display area B.

Herein, the gate line 122 transmits a gate signal, which is supplied, via the gate link 128 which is connected to the gate pad 180, from a gate driver (not shown), to the gate electrode 124 that comprises the thin film transistor T.

The data line 142 transmits a data signal, which is supplied, via the data link 148 which is connected to the data pad 190, from a data driver (not shown), to the source electrode 144 and the drain electrode 146 that comprises the thin film transistor T in conjunction with an on/off of the gate electrode 124.

The thin film transistor T charges a pixel signal which is supplied with the data line 142 into the pixel electrode 160 in response to a gate signal which is supplied from the gate line 122, and has the gate electrode 124 which is connected to the gate line, the source electrode 144 which is connected to the data line 142, and the drain electrode 146 which is opposed to the source electrode 144 with having a channel therebetween.

In this case, the thin film transistor T further includes an active layer 132 and an ohmic contact layer 134. Herein, the active layer 132 is overlapped with the gate electrode 124 with having the gate insulating film 110 therebetween to form a channel between the source electrode 144 and the drain electrode 146. The ohmic contact layer 134 is formed on the active layer 132 other than a channel area in order to make an ohmic contact with the source electrode 144 and the drain electrode 146.

In this case, the active layer 132 and the ohmic contact layer 134 are overlapped with the data line 142 and the lower data pad electrode 192.

The protective film 150 covers the thin film transistor T which is formed on the gate insulating film 110 and, at the same time protects the active layer 132 which forms a channel and a pixel area 165 from moisture or a scratch which is generated upon carrying out of the next process.

Herein, the protective film 150 is made from an inorganic insulating material such as a SiNx, and an organic insulating material such as an acrylic organic compound, BCB (benzocyclobutene) or PFCB (perfluorocyclobutane), etc. The protective film 150 is deposited on the gate insulating film 110 by a sputtering or a PECVD technique.

In this case, a first to third contact holes 151, 152, and 153 are formed at the protective film 150 by a photolithography process using a mask. Herein, the first contact hole 151 passes through the protective film 150 to expose the drain electrode 146. The second contact hole 152 passes through the protective film 150 and the gate insulating film 110 to expose the lower gate pad electrode 182. The third contact hole 153 passes through the protective film 150 to expose the lower data pad electrode 192.

The pixel electrode 160 is formed at the pixel area 165 where comprises the display area A by a contact hole filling process CHF using a smoothing material 200, for example, an over-coat layer.

In this case, the pixel electrode 160 is connected, via the first contact hole 151 that passes through the protective film 150, to the drain electrode 146 of the thin film transistor T to form at the pixel area 165. In this case, an electric field is formed between the pixel electrode 160 to which a pixel signal is supplied via the thin film transistor T and a common electrode (not shown) to which a reference voltage is supplied.

Accordingly, liquid crystal molecules, which are arranged between the thin film transistor substrate and the color filter substrate by an electric field which is formed between the pixel electrode 160 and the common electrode, are rotated due to a dielectric anisotropy. Transmittance of a light transmitting the pixel area 165 is differentiated depending upon a rotation extent of the liquid crystal molecules to realize a gray scale.

The storage capacitor 170 is comprised of the gate line 122 and the pixel electrode 160 which is formed to be overlapped with the gate line 122 with having the gate insulating film 110 and the protective film 150 therebetween. Such a storage capacitor 170 allows a pixel signal charged in the pixel electrode 160 to be stably maintained until the next signal is charged.

The gate pad 180 is connected to the gate line 122 with having the gate link 128 therebetween. The gate pad 180 supplies a gate signal, which is supplied from a gate driver (not shown), to the gate line 122 via the gate link 128.

Such a gate pad 180 is comprised of the lower gate pad electrode 182, the second contact hole 152, and an upper gate pad electrode 184. Herein, the lower gate pad electrode 182 is extended from the gate line 122. The second contact hole 152 passes through the gate insulating film 110 and the protective film 150. The upper gate pad electrode 184 is connected, via the second contact hole 152, to the lower gate pad electrode 182.

In this case, the upper gate pad electrode 184 that comprises the gate pad 180 is formed at the non-display area B by a contact hole filling process CHF using the above-mentioned smoothing material 200.

The data pad 190 is connected to the data line 142 with having the data link 148 therebetween. The data pad 190 supplies a data signal, which is supplied from a data driver (not shown), to the data line 142 via the data link 148.

Such a data pad 190 is comprised of the lower data pad electrode 192, the third contact hole 153, and an upper data pad electrode 194. Herein, the lower data pad electrode 192 is extended from the data line 142 to be formed on the gate insulating film 110. The third contact hole 153 passes through the protective film 150. The upper data pad electrode 194 is connected, via the third contact hole 153, to the lower data pad electrode 192.

In this case, the upper data pad electrode 194 that comprises the data pad 190 is formed at the non-display area B by a contact hole filling process CHF using the above-mentioned smoothing material 200.

Hereinafter, a method of fabricating the thin film transistor substrate according to the present invention will be described in detail with reference to the accompanying drawings.

First, a process of forming a gate pattern of the thin film transistor according to the present invention will be described with reference to FIG. 5A and FIG. 5B. Herein, FIG. 5A and FIG. 5B are a plan view and a sectional view showing the thin film transistor substrate provided with a gate pattern.

Figure 5A:
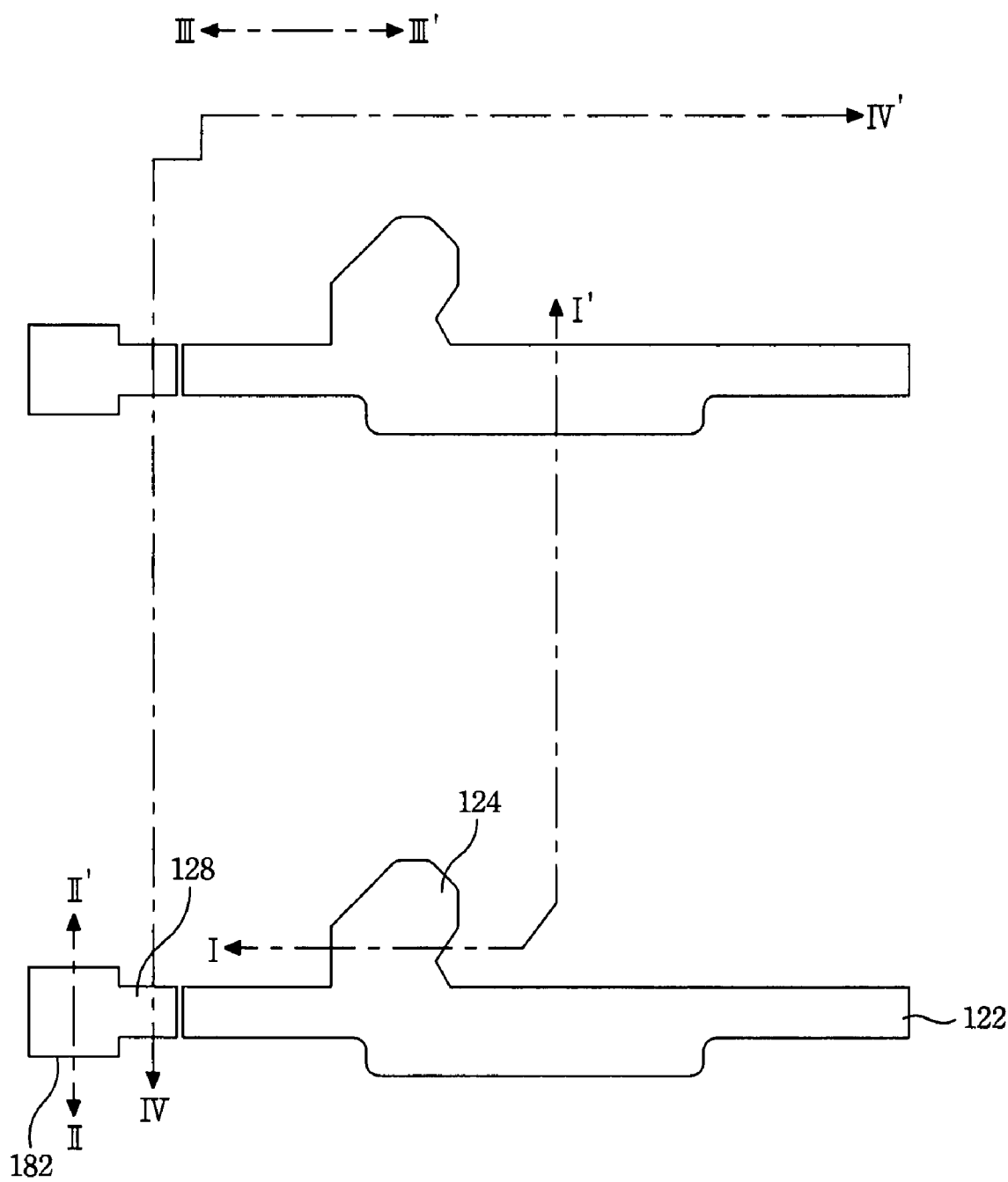
FIG. 5A and FIG. 5B are a plan view and a sectional view showing the thin film transistor substrate provided with a gate pattern by a first mask process according to the present invention.
Figure 5B:
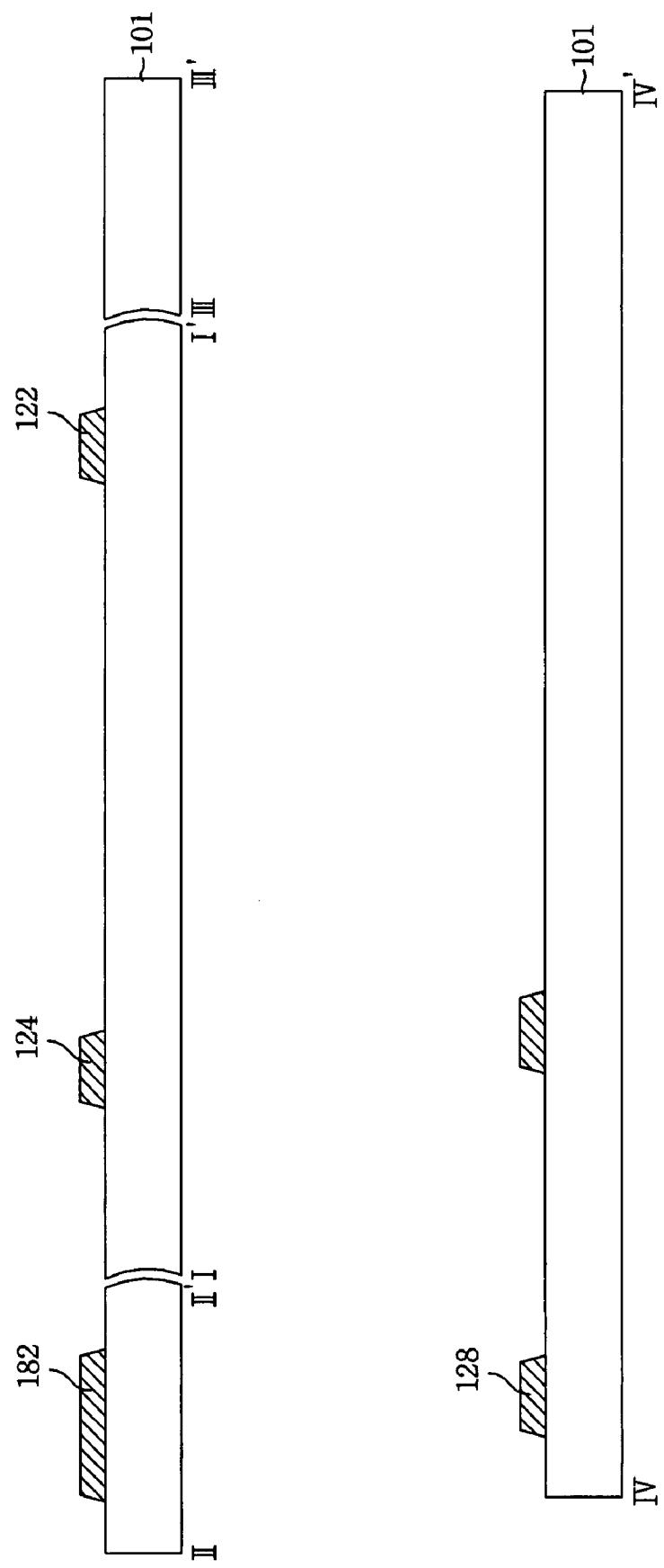

Referring to FIG. 5A and FIG. 5B, a gate pattern is formed by a first mask process. Herein, the gate pattern includes the gate line 122 and the gate electrode 124 which are formed at the display area A, and the lower gate pad electrode 182 and the gate link 128 which are formed at the non-display area B.

More specifically, a gate metal layer is formed on the substrate 101 by a disposition technique such as the sputtering, etc. Herein, the gate metal layer is formed of Al group metal, Cu, Cr, Mo, etc.

Next, a photo-resist is formed on an entire gate metal layer, and then a photo-resist pattern, which exposes a gate metal layer, is formed by the photolithography process and an etching process using a first mask.

Next, a gate pattern is formed by an etching process using a photo-resist pattern as an etching resist. Herein, the gate pattern is comprised of the gate line 122, the gate electrode 124, the lower gate pad electrode 182, and the gate link 128 that electrically connects the gate line 122 with the lower gate pad electrode 182.

Figure 6A:
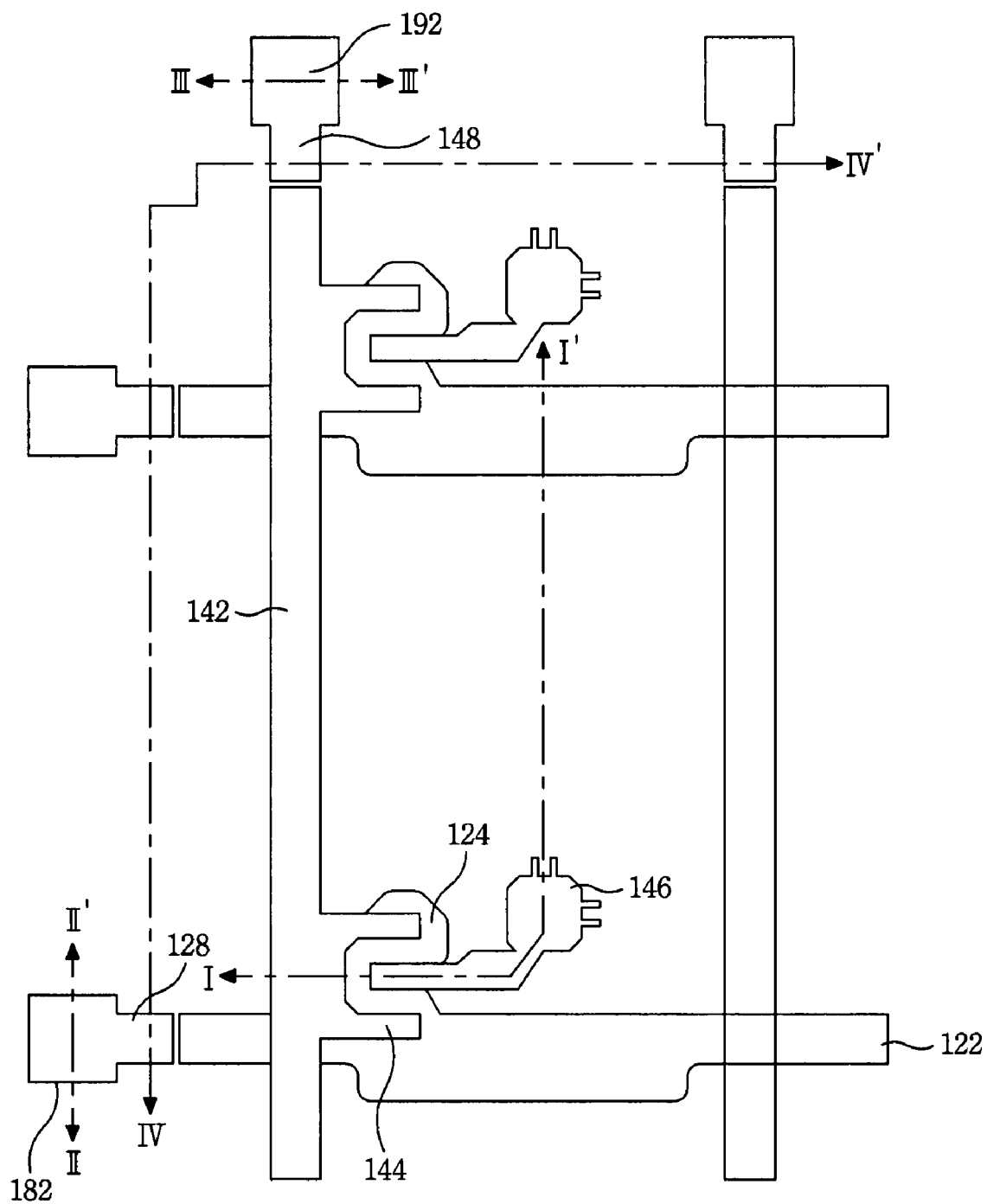
FIG. 6A and FIG. 6B are a plan view and a sectional view showing the thin film transistor substrate provided with a gate pattern by a second mask process according to the present invention.
Figure 6B:
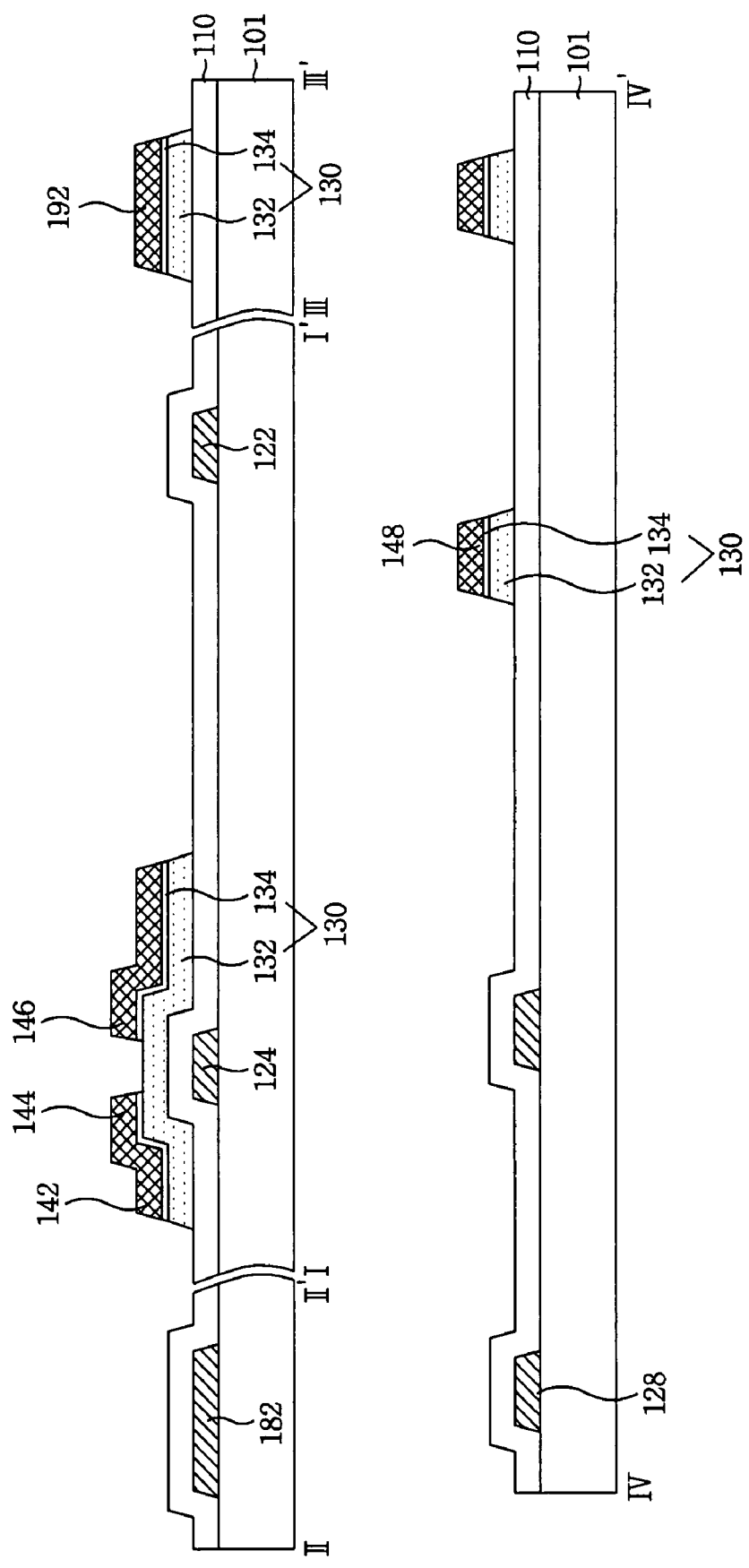

As described above, after the gate pattern is formed, a data pattern is formed by a second mask process as shown in FIG. 6A and FIG. 6B. Herein, the data pattern is comprised of a semiconductor pattern 130 that forms a channel, the data line 142 that is formed at the display area A, the source electrode 144 and the drain electrode 146 which are connected to the data line 142, the lower data pad electrode 192 and the data link 148 that are formed at the non-display area B.

Figure 7A:
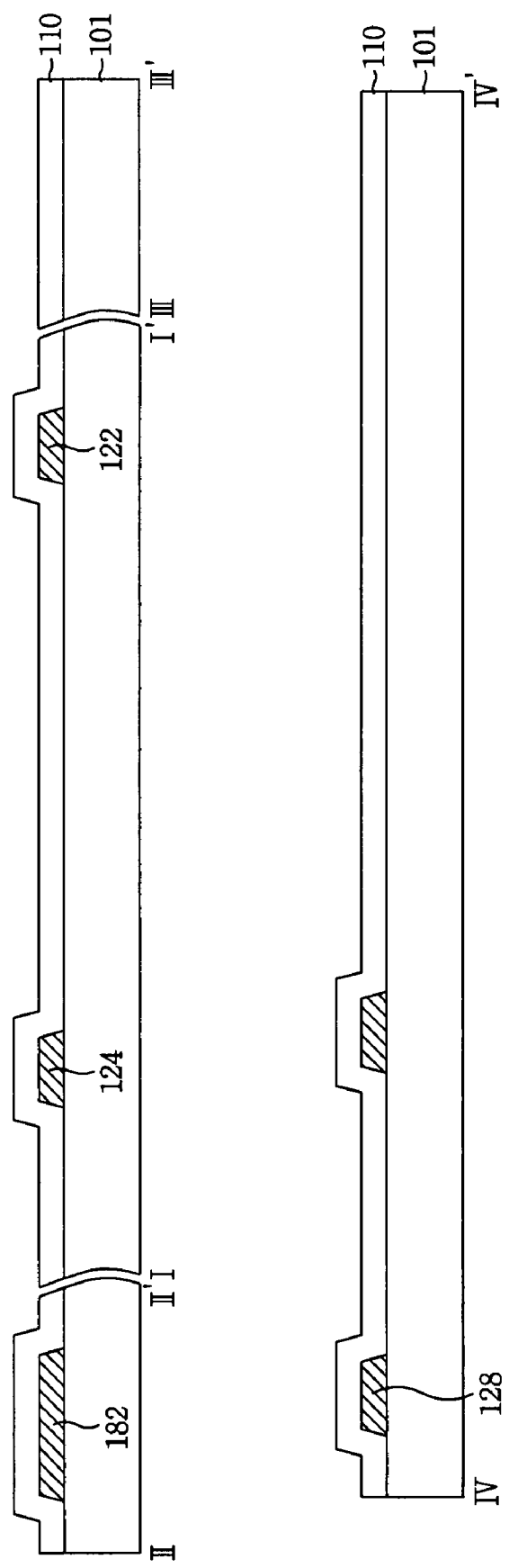

More specifically, the gate insulating film 110 is disposed on the entire substrate 101 provided with a gate pattern by the deposition technique such as the PECVD, and the sputtering, etc as shown in FIG. 7A.

Herein, the gate insulating film 110 is made from an inorganic insulating material such as a SiOx or a SiNx, etc.

Figure 7B:
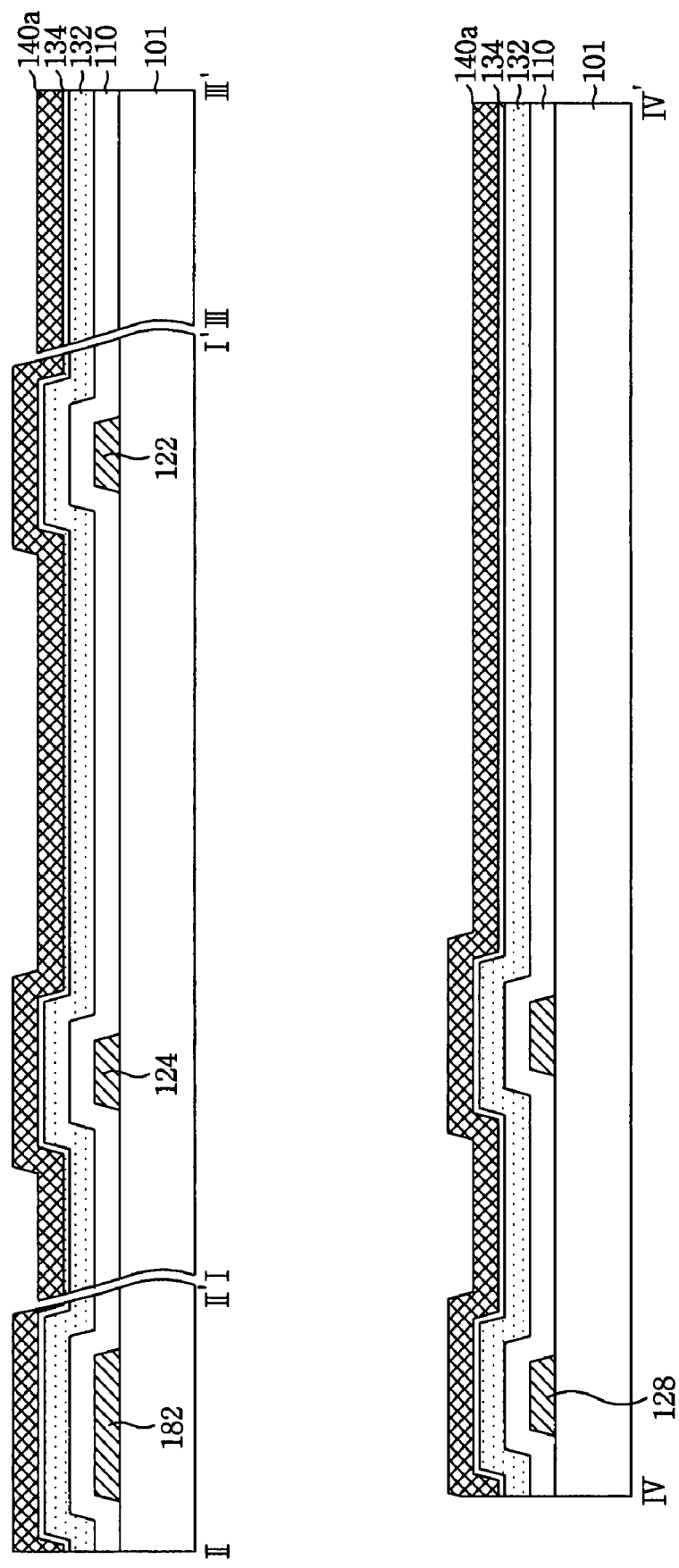
Figure 7E:
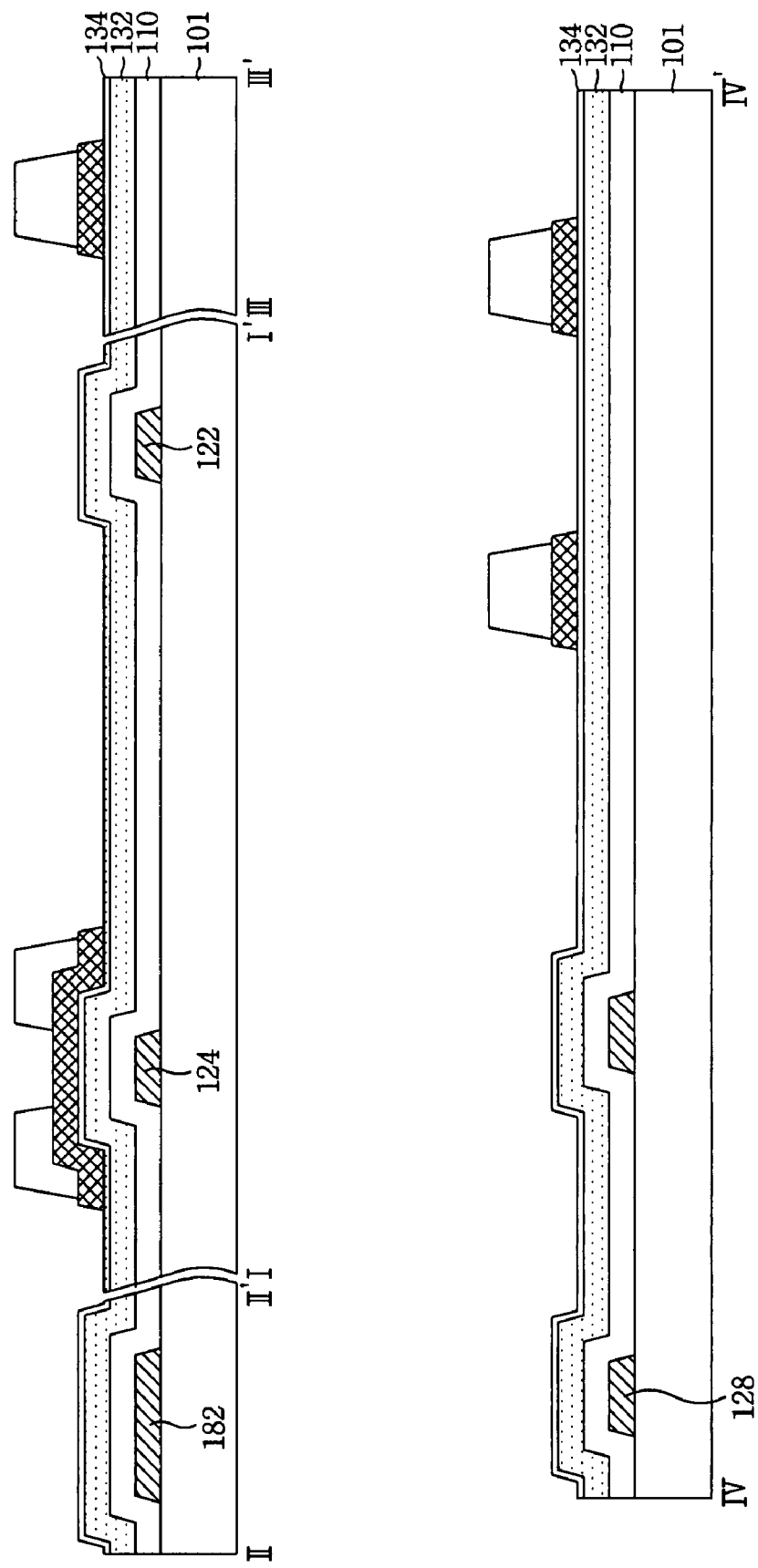

Next, an amorphous silicon layer 132, an amorphous silicon layer 133 doped with an $n^+$ impurity, and a data metal layer 140a, which form a semiconductor pattern, are sequentially deposited on the gate insulating film 110 by the deposition technique such as the PECVD, and the sputtering, etc as shown in FIG. 7B.

Herein, the data metal layer 140a is made from Mo, Ti, Ta, and Mo alloy, etc.

Next, a photo-resist is coated on an entire data metal layer 140a, and then a photo-resist pattern PR having step coverage is formed on the data metal layer 140a by a photolithography process using a diffractive exposure mask, that is, a second mask as shown in FIG. 7C.

Herein, a second mask 300 is a half tone mask where a diffractive exposure part (or a half transmitting part) is formed to correspond to an area to be formed a channel of the thin film transistor T.

A photo-resist pattern PR, which is formed at a channel area of the thin film transistor T, is formed to have a height lower than a photo-resist pattern which is formed at another area.

As described above, a photo-resist pattern PR provided with step coverage is formed on the data metal layer 140a, and then the data metal layer 140a, which is exposed by the photo-resist pattern PR, is removed by a wet etching as shown in FIG. 7D.

Next, a photo-resist pattern PR that covers a channel area is removed by an ashing process using $O_2$ plasma to expose the data metal layer 140a which is formed at a channel area of the thin film transistor T.

In this case, a part of a photo-resist pattern PR, which covers an area to be formed the data line 142, the lower data pad electrode 192, and the data link 148, is removed by the ashing process using $O_2$ plasma.

Figure 7F:
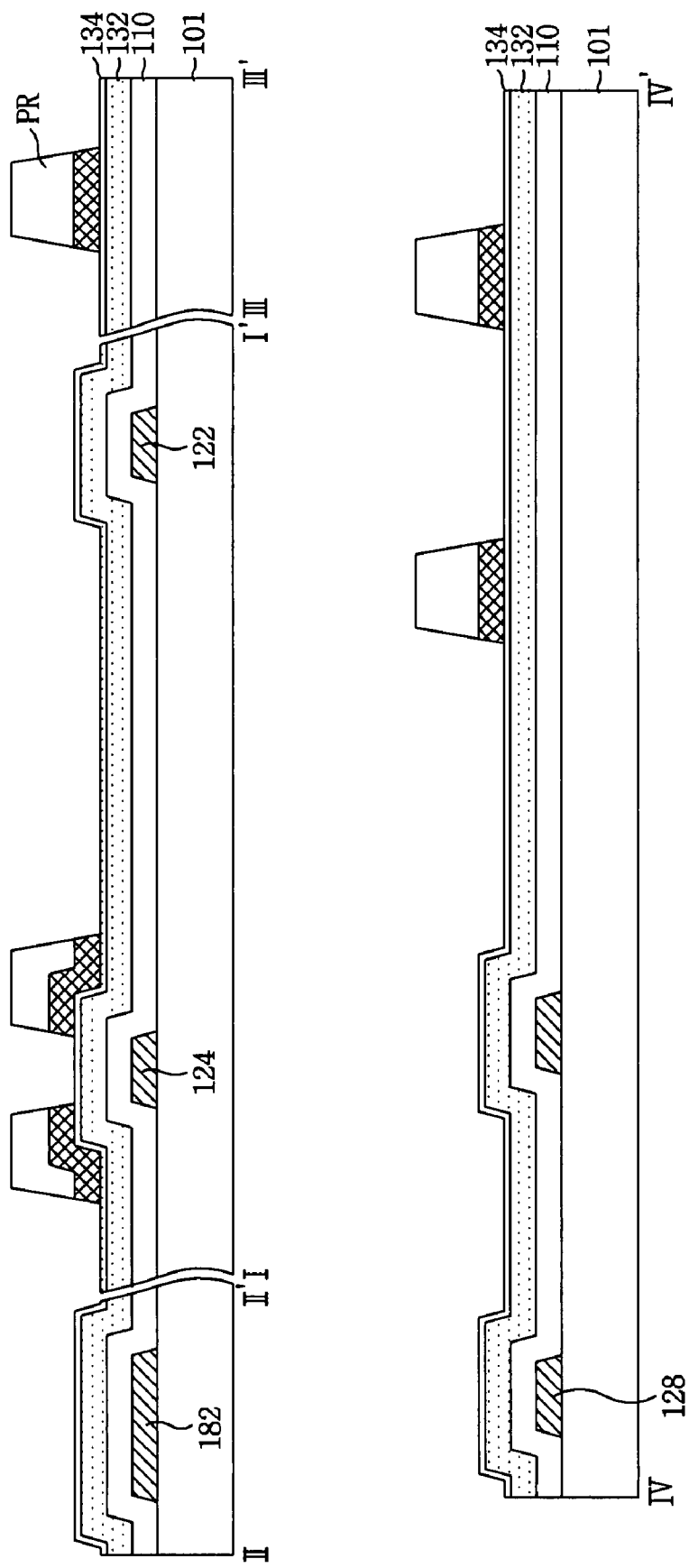

Next, the data metal layer 140a, which is exposed by the ashed photo-resist pattern PR, is removed by a dry etching to separate the data metal layer 140a into the source electrode 144 and the drain electrode 146 and, at the same time open the ohmic contact layer 134 which is formed at a channel area as shown in FIG. 7F.

Figure 7G:
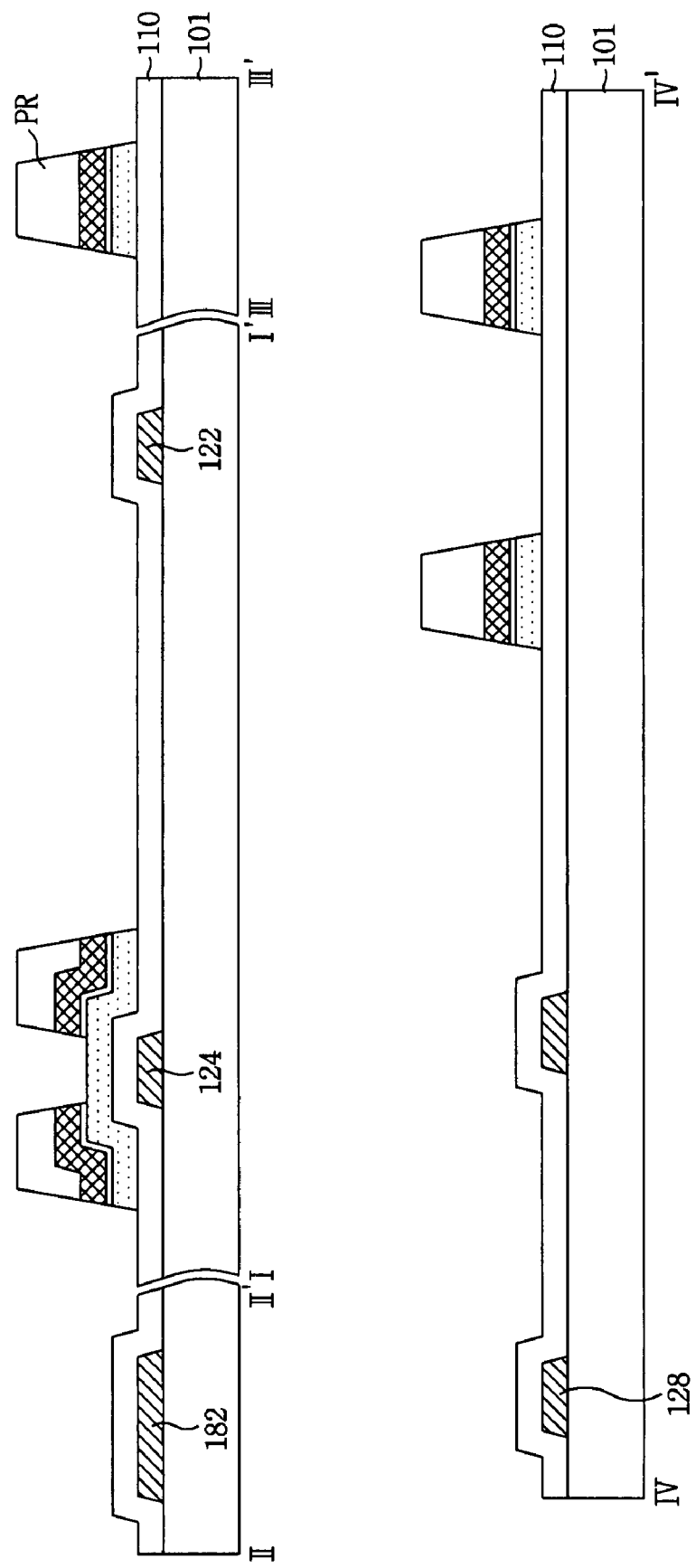

As described above, the opened ohmic contact layer 134 is removed by the dry etching to open the active layer 132 that forms a channel, thereby providing the active layer 134 that forms a channel and the ohmic contact layer 134 that carries out an ohmic contact between the source electrode 144 and the drain electrode 146 as shown in FIG. 7G.

Figure 7H:
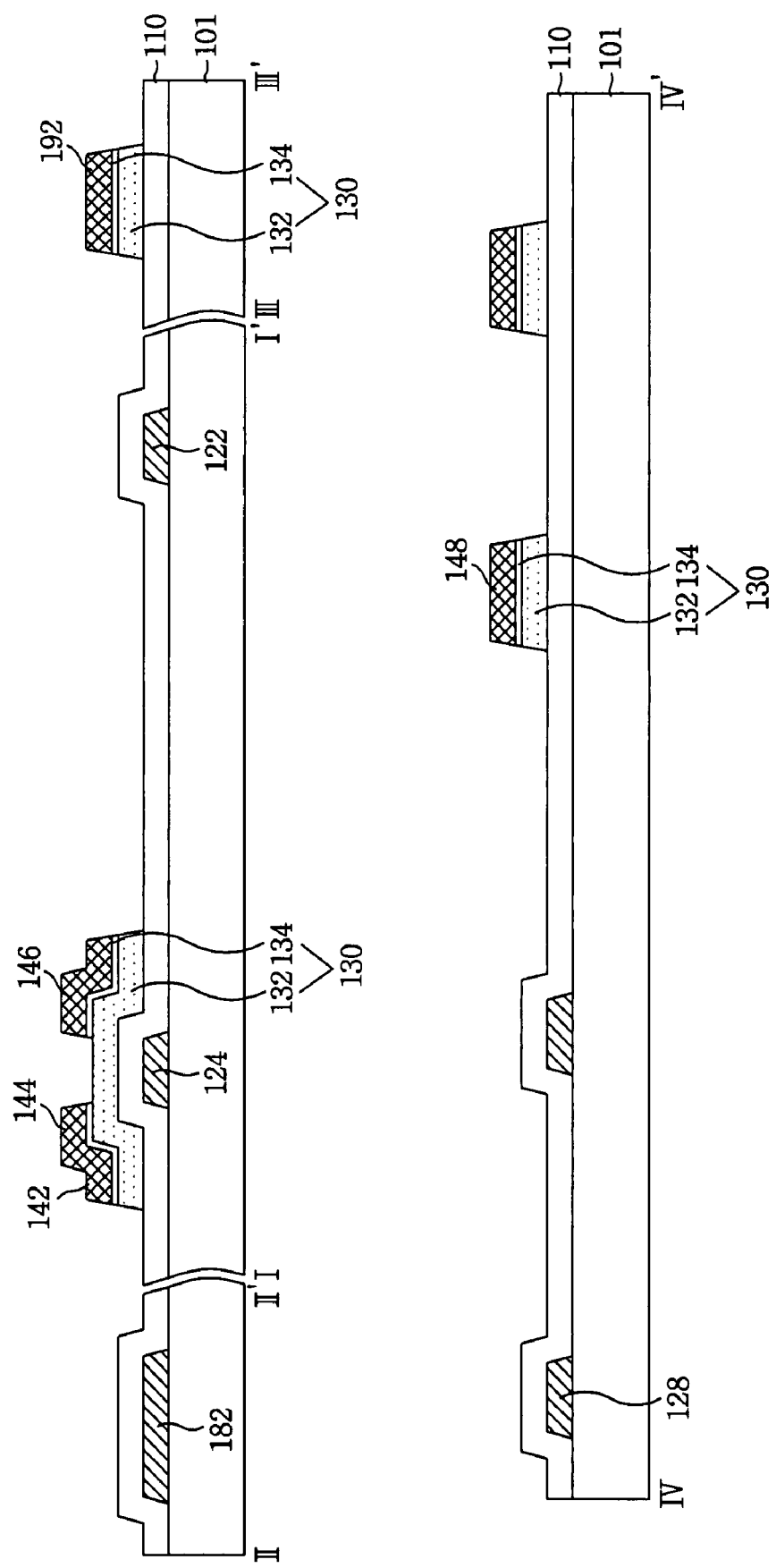

Next, the remaining photo-resist pattern PR is removed by a stripping process to form a data pattern as shown in FIG. 7H. Herein, the data pattern is comprised of a semiconductor pattern 130 that forms a channel of the thin film transistor 140, the data line 142 that is formed at the display area A, the source electrode 144 and the drain electrode 146 which are connected to the data line 142, the lower data pad electrode 192 and the data link 148 that are formed at the non-display area B.

Figure 8A:
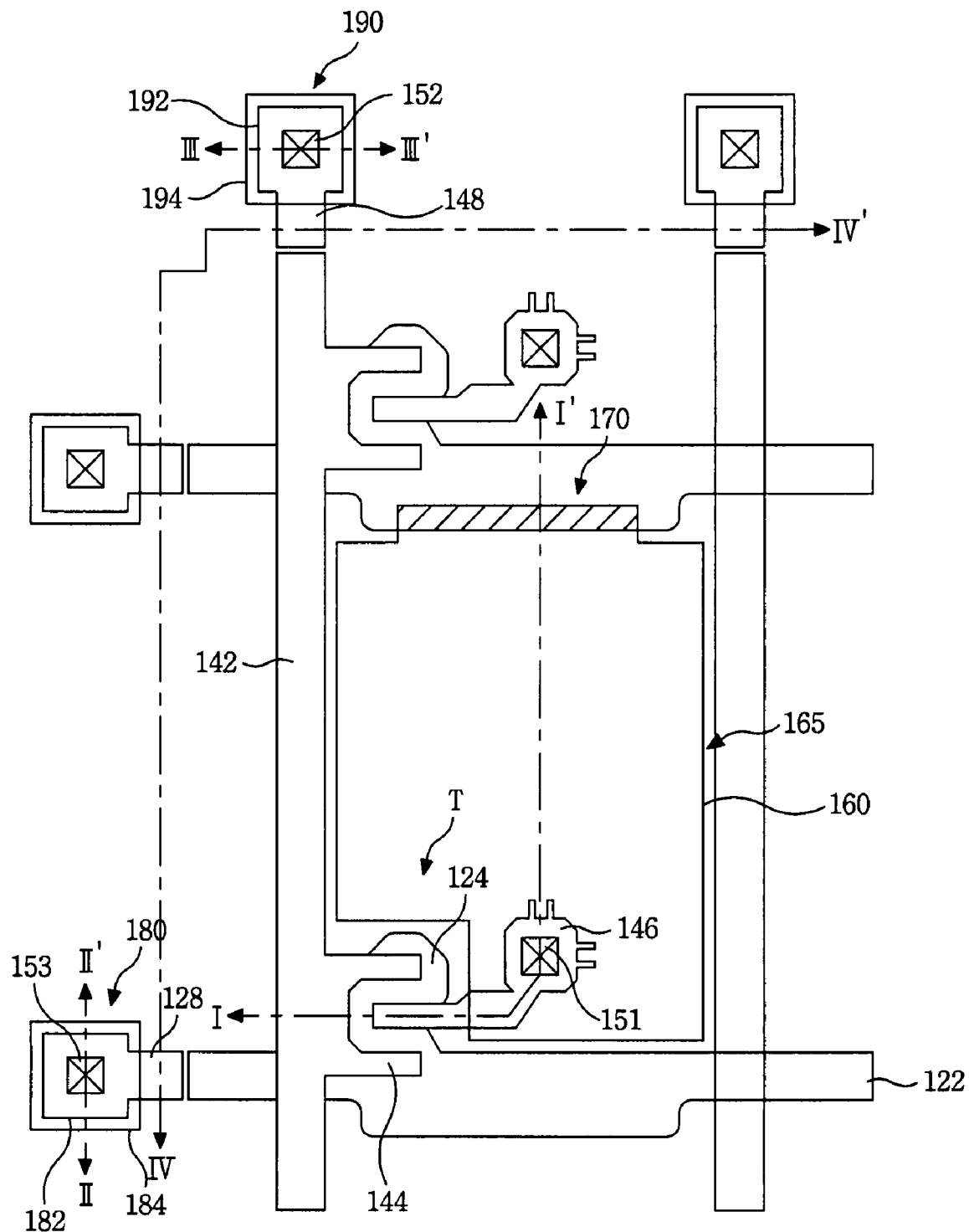

As described above, after a data pattern is formed, a conductive pattern is formed by a contact hole filling method CHF using a third mask process as shown in FIG. 8A and FIG. 8B. Herein, the conductive pattern is comprised of the protective film 150 where a plurality of contact holes is formed, the pixel electrode 160 which is formed at the display area A, and the upper gate pad electrode 184 and the upper data pad electrode 194 which are formed at the non-display area B.

More specifically, the protective film 150 is deposited on entire insulating film 110 provided with a second conductive pattern.

Figure 9A:
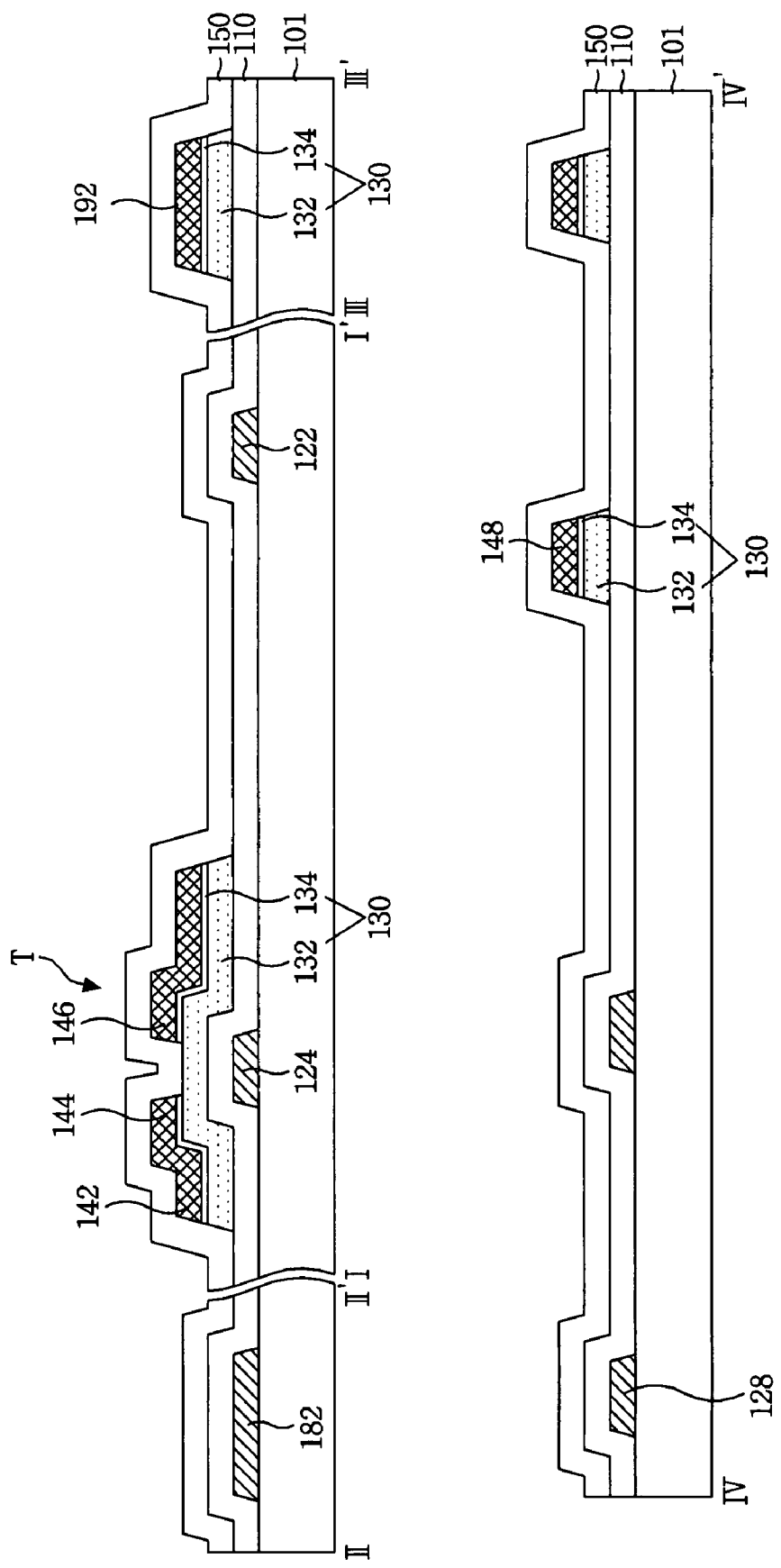
Figure 9B:
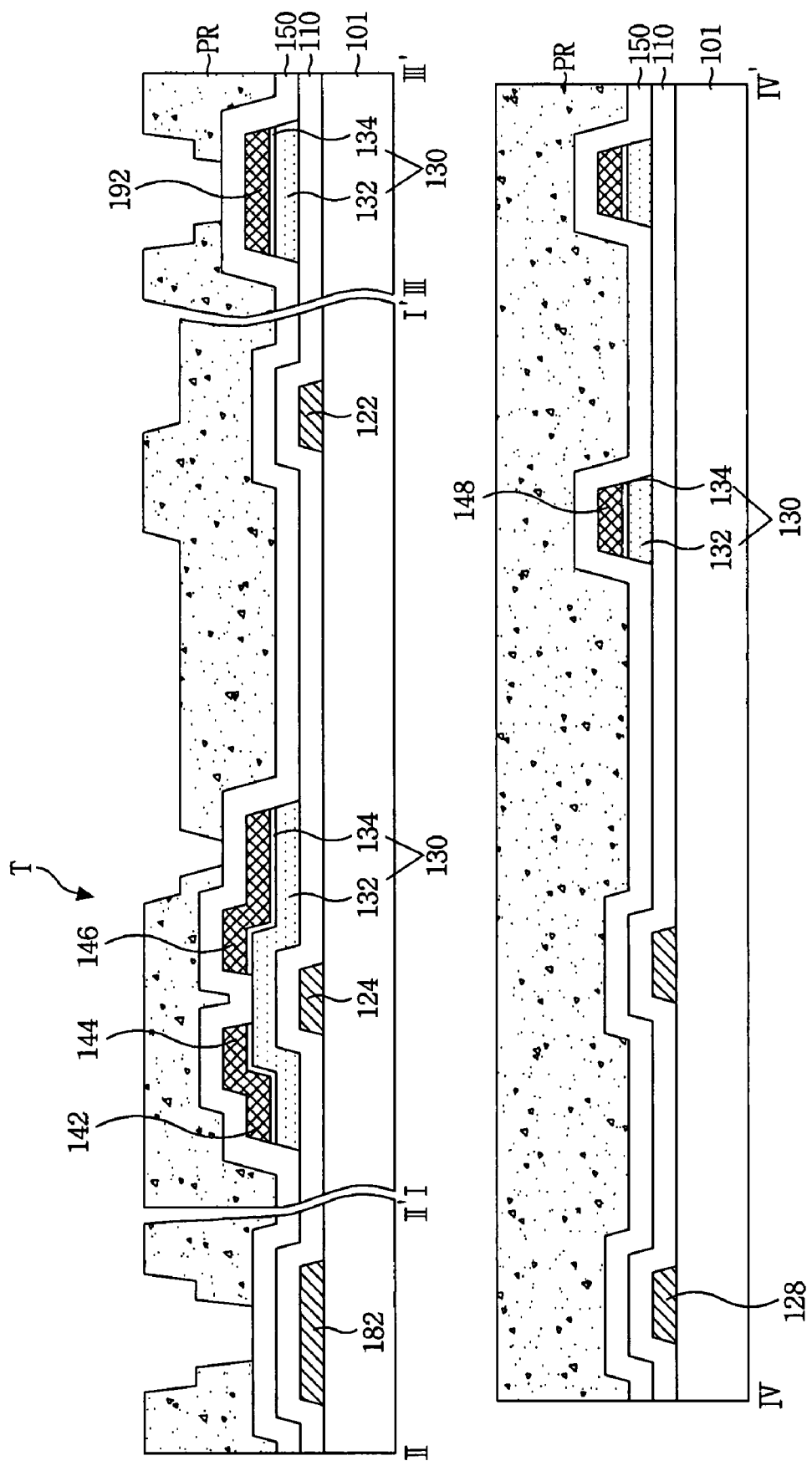

Next, a first photo-resist is deposited on an entire protective film 150, and then a photo-resist pattern PR having step coverage is formed on the protective film 150 by a photolithography process and an etching process using a diffractive exposure mask, that is, a third mask as shown in FIG. 9B.

Herein, a third mask is a diffractive exposure mask where a diffractive exposure part (or a half transmitting part) is formed at an area to be formed the pixel electrode 160, a transmitting part is formed at an area to be formed the contact holes 151, 152, and 153, and a shielding part is formed at an area other than thereof.

Figure 9C:
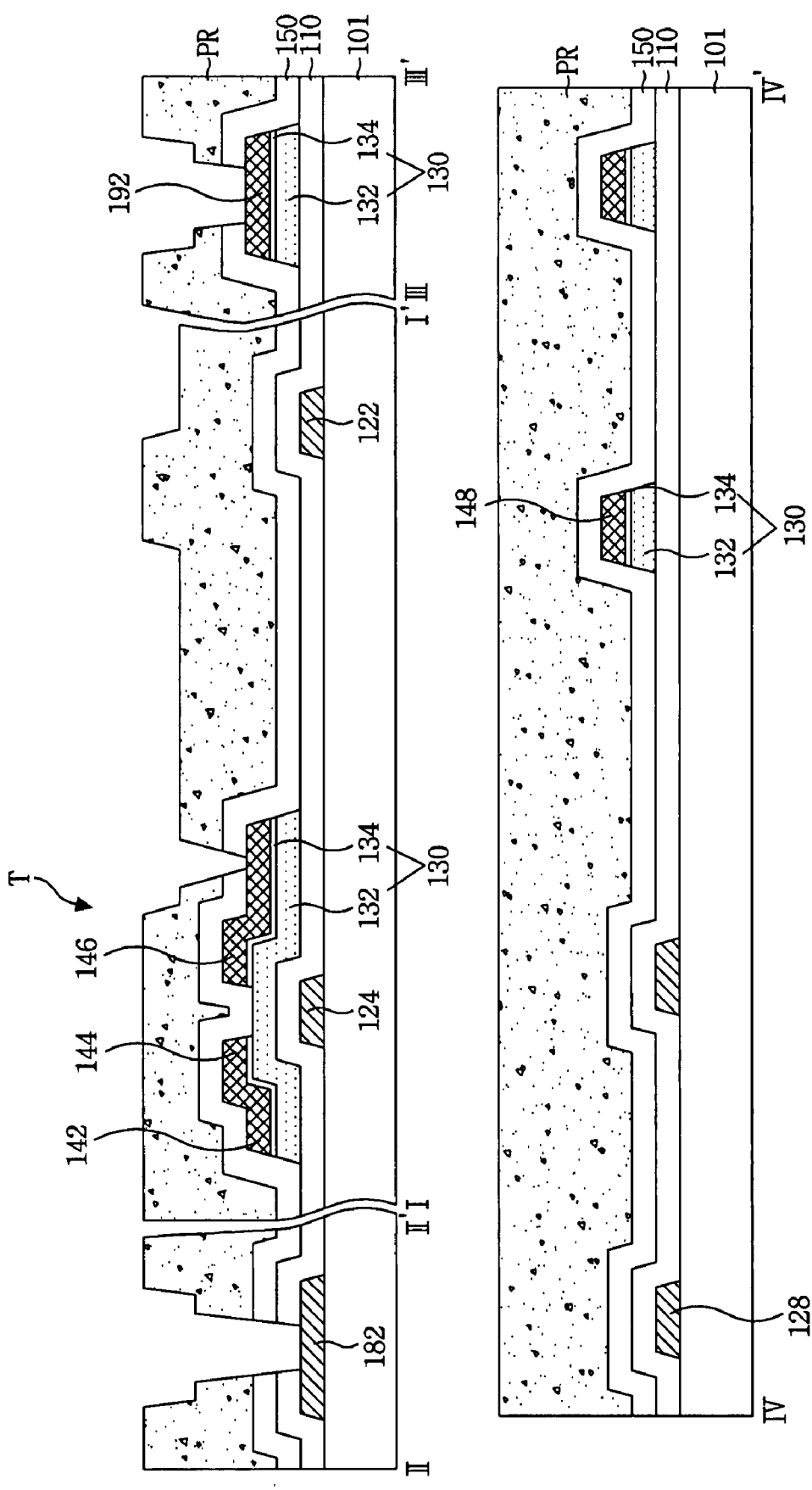

As described above, after a photo-resist pattern PR having step coverage is formed on the protective film 150, the first to third contact holes 151, 152, and 153 are formed by carrying out the dry etching regarding the protective film 150 which is exposed by a photo-resist pattern PR as shown in FIG. 9C.

Herein, the first contact hole 151 passes through the protective film 150 to expose the drain electrode 146, the second contact hole 152 passes through the protective film 150 and the gate insulating film 110 to expose the lower gate pad electrode 182, and the third contact hole 153 passes through the protective film 150 to expose the lower data pad electrode 192.

Next, an ashing process regarding a photo-resist pattern PR using $O_2$ plasma is carried out to remove a photo-resist pattern PR which is formed at the pixel area 165 to be formed the pixel electrode 160 as shown in FIG. 9D.

Figure 9E:
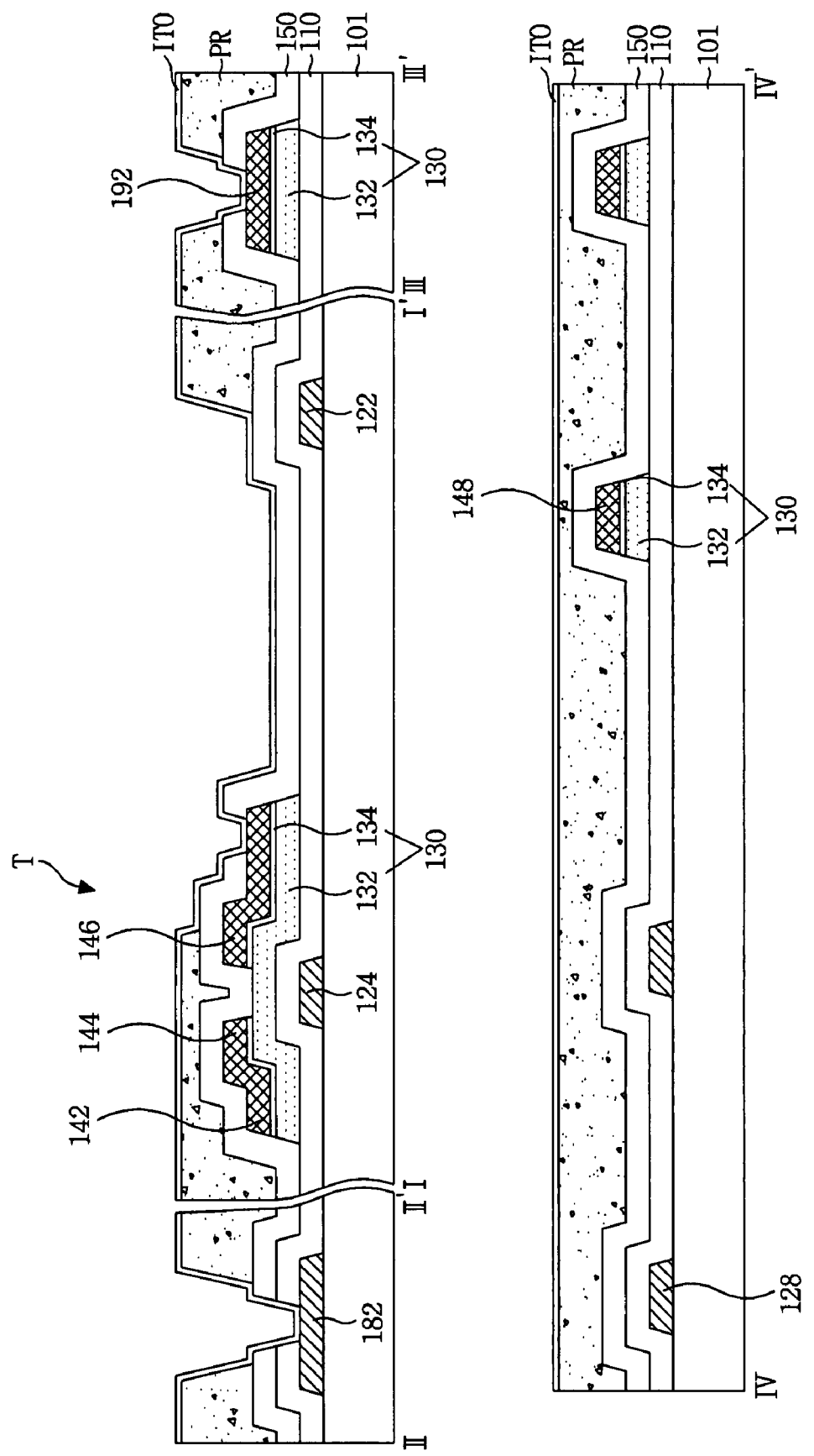

Next, a transparent conductive film ITO is formed on the entire ashed photo-resist pattern PR as shown in FIG. 9E. Herein, the transparent conductive film ITO forms a conductive pattern that is comprised of the pixel electrode, the upper gate pad electrode, and the upper data pad electrode.

Figure 9F:
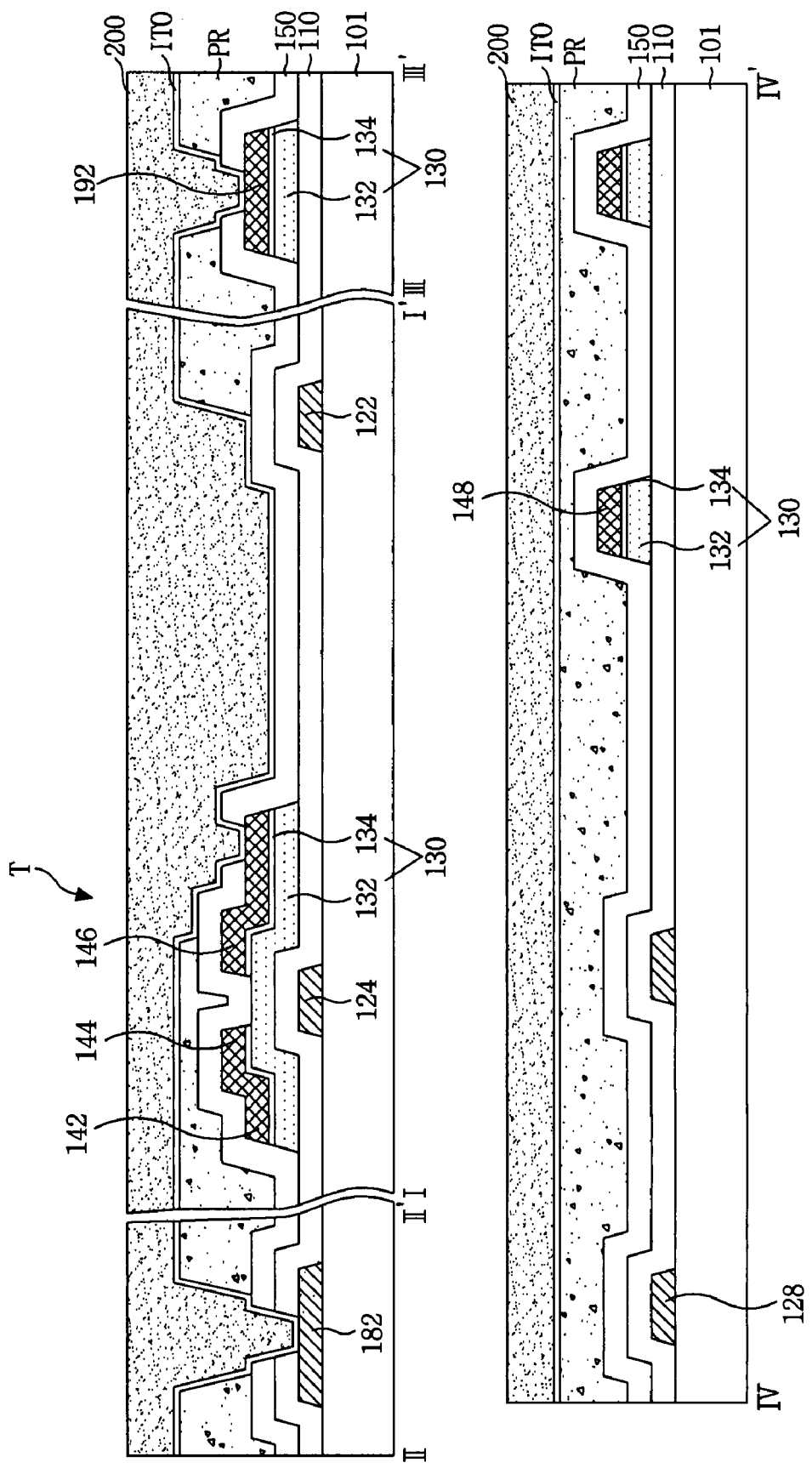

As described above, after a transparent conductive film ITO is entirely deposited, a smoothing layer 200 which is made from a smoothing material covering a photo-resist pattern PR provided with the transparent conducive film ITO, that is, an over-coat layer is formed as shown in FIG. 9F.

Next, an ashing process regarding the smoothing layer 200, which covers a photo-resist pattern, is carried out to expose a transparent conductive layer which is formed at another area other than an area to be formed a conductive pattern among transparent conductive films ITO which are formed on a photo-resist pattern 550.

In other words, a transparent conductive film ITO, which is formed at another area other than an area to be formed a conductive pattern including the pixel electrode 160, the upper gate pad electrode 184, and the upper data pad electrode 194, is exposed to the exterior by carrying out an ashing process regarding the smoothing layer 200.

In order to form the above-mentioned conductive pattern, a transparent conductive film ITO, which is formed at the non-display area B, is exposed to the exterior by an ashing process regarding a smoothing layer.

Figure 9H:
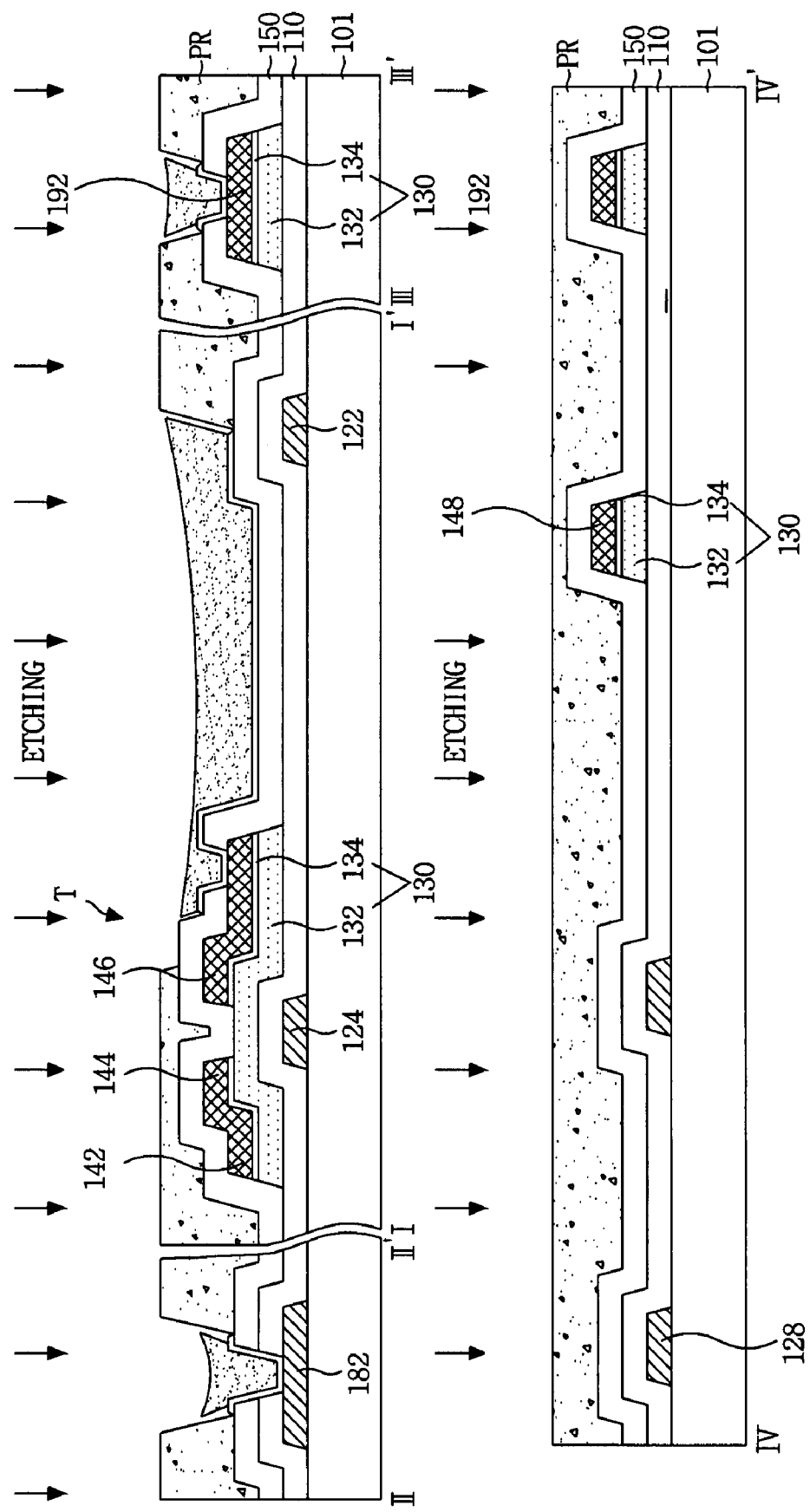

As described above, after a transparent conductive film ITO is exposed to the exterior, a transparent conductive film ITO, which is exposed on a photo-resist pattern PR, is removed by the wet etching as shown in FIG. 9H.

In this case, in order to form the above-mentioned conductive pattern, a transparent conducive film ITO, which is formed at the non-display area B, is also removed by the etching process.

More specifically, secondary photo-resists, which are formed at the display area A and the non-display area B, are formed to have the same thickness in the case where a contact hole filling process is carried out by use of a secondary photo-resist instead of the smoothing material 200 that covers a photo-resist pattern PR of the related art.

In this case, secondary photo-resist, which is formed at the non-display area B, is remained in a state in which a part thereof is ashed in the case where a secondary photo-resist is ashed in order to expose a transparent conductive film ITO which is formed on a photo-resist pattern PR of the display area A of the thin film transistor substrate.

Accordingly, a transparent conductive film ITO is not etched by a secondary photo-resist which remains in a state in which a secondary photo-resist is not ashed. Thus, a transparent conductive film ITO remains at the non-display area B.

Furthermore, a secondary photo-resist, which is formed at the display area A, is all ashed in the case where a secondary photo-resist, which is formed at the non-display area B, is all ashed. Thus, there is raised a problem in that a conductive pattern such as the pixel electrode 160, the upper gate pad electrode 184, and the upper data pad electrode 194, etc is not formed.

Accordingly, if a contact hole filling process is carried out by use of a smoothing material, a transparent conductive film ITO, which is formed at the non-display area B, is removed by the etching process to solve a problem of remaining a transparent conductive film at the non-display area B.

As described above, after a transparent conductive film ITO, which is exposed to the exterior, is removed, a stripping process regarding a photo-resist pattern and a smoothing layer, which remain on the substrate, is carried out to form a third conductive pattern including the pixel electrode 160, the upper gate pad electrode 182, and the upper data pad electrode 192 on the protective film 150.

Herein, the pixel electrode 160 is connected, via the first contact hole 151 which passes through the protective film 150, to the drain electrode 146 of the thin film transistor T to form an electric field that aligns a liquid crystal together with a common electrode. In this case, the pixel electrode 160 is overlapped with the gate line 122 with having the gate insulating film 110 and the protective film 150 therebetween to form the storage capacitor 170.

The upper gate pad electrode 182 is connected, via the second contact hole 152 which passes through the protective film 150 and the gate insulating film 110, to the upper gate pad electrode 182.

Furthermore, the upper data pad electrode 192 is connected, via the third contact hole 153 which passes through the protective film 150, to the lower data pad electrode 192.

As described above, the present invention manufactures a substrate through a contact hole filling process to reduce the number of a mask process and a manufacturing cost.

The present invention manufactures a substrate through a contact hole filling process using a smoothing layer to remove a transparent conductive film which remains on the substrate. As a result, the present invention prevents a defect such as a short between circuits.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a thin film transistor substrate, including a display area which has liquid crystal cells arranged in a matrix type, and a non-display area where is located at an exterior of the display area, the method comprising:

forming a gate pattern that is comprised of a gate line which is formed at the display area, a gate electrode which is connected to a gate line, a gate link which is formed at the non-display area, and a lower gate pad electrode which is connected, via the gate link, to the gate line;

forming a gate insulating film on a substrate provided with the gate pattern, and then forming a data pattern that is comprised of a data line which is formed at the display area and is crossed with the gate line, a source electrode and a drain electrode which are connected to the data line, a data link which is formed at the non-display area, and a lower data pad electrode which is connected, via the data link, to the data line; and forming a protective film on the entire substrate provided with the data pattern, and then forming a conductive pattern that is comprised of a pixel electrode which is formed at the display area by a contact hole filling process using an over-coat layer, and an upper gate pad electrode and an upper data pad electrode which are formed at the non-display area, wherein the conductive pattern which is formed at the non-display is exposed to the exterior by an ashing process regarding the over-coat layer, wherein no conductive patterns exist at the non-display area outside the upper gate pad electrode and the upper data pad electrode, wherein the step of forming the conductive pattern includes forming the protective film on the entire substrate, and then forming a photo-resist pattern that exposes the protective film by a third mask process, etching the protective film which is exposed by the photo-resist pattern to form a plurality of contact holes, drying-ashing the photo-resist pattern provided with the contact hole to remove the photo-resist pattern which is formed at a pixel area, forming a transparent conductive film on the entire ashed photo-resist pattern, and then covering the photo-resist pattern provided with the transparent conductive film with the over-coat layer, ashing the over-coat layer which covers the display area and the non-display area to expose the transparent conductive film which is formed at another area other than an area to be formed the conductive pattern, etching the transparent conductive film which is exposed at the display area and the non-display area to form the conductive pattern and removing the photo-resist pattern and the over-coat layer which remain on the substrate by a stripping process, wherein the transparent conductive film, which is formed at another area other than an area to be formed a conductive pattern including the pixel electrode, the upper gate pad electrode, and the upper data pad electrode, is exposed to the exterior by carrying out the ashing process regarding the over-coat layer, wherein the transparent conductive film, which is formed at the non-display area is exposed to the exterior by the ashing process regarding the over-coat layer to form the conductive pattern.

2. The method of fabricating the thin film transistor substrate according to claim 1, further includes:

forming a storage capacitor that is comprised of the gate line, the gate insulating film, and the pixel electrode which is formed to be overlapped with the gate line with having the protective film between.

3. The method of fabricating the thin film transistor substrate according to claim 1, wherein the step of forming the gate pattern includes:

forming a gate metal layer on a substrate of the display area and the non-display area;

forming a photo-resist on the entire gate metal layer, and then forming a photo-resist pattern that exposes the gate metal layer by a first mask process;

etching the gate metal layer which is exposed by the photo-resist pattern to form the gate pattern; and removing the photo-resist pattern which remains on the substrate by a stripping process.

4. The method of fabricating the thin film transistor substrate according to claim 1, wherein the step of forming the data pattern includes:

sequentially forming the gate insulating film that covers the gate pattern, a semiconductor layer that forms a channel, and a data metal layer on the substrate of the display area and the non-display area;

forming a photo-resist on the entire data metal layer, and then forming a photo-resist pattern having step coverage at a channel area by a second mask process;

etching the data metal layer which is exposed by the photo-resist pattern, and then ashing the photo-resist pattern to expose a data metal layer which is formed at the channel area;

etching the data metal layer which is exposed at the channel area to form the data pattern, and then etching the semiconductor layer which is exposed at the channel area to form a semiconductor pattern which is comprised of an active layer and an ohmic contact layer; and removing the photo-resist pattern which remains on the substrate by a stripping process.

5. The method of fabricating the thin film transistor substrate according to claim 4, wherein the second mask is a half tone mask where a diffractive pattern is formed to correspond to the channel area.

6. The method of fabricating the thin film transistor substrate according to claim 1, wherein the three mask is a diffractive exposure mask having a diffractive exposure part, transmitting part and a shielding part, wherein the diffractive exposure part is formed at an area to be formed the pixel electrode, a transmitting part is formed at an area to be formed the plurality of contact holes, and a shielding part is formed an area other than thereof.

7. The method of fabricating the thin film transistor substrate according to claim 6, wherein the step of forming a contact hole on the protective film includes:

forming a first contact hole that passes through the protective film to expose the drain electrode;

forming a second contact hole that passes through the protective film and a gate insulating film to expose the lower gate pad electrode; and forming a third contact hole that passes through the protective film to expose the lower data pad electrode.

8. The method of fabricating the thin film transistor substrate according to claim 6, wherein the transparent conductive film, which is formed at the non-display area, is all exposed in the step of exposing the transparent conductive film.

9. The method of fabricating the thin film transistor substrate according to claim 6, wherein the transparent conductive film, which is exposed at the non-display area, is all etched, so that a transparent conductive film does not remain at the non-display area in the step of etching the exposed transparent conductive film.

10. A method of fabricating the thin film transistor substrate comprising:

forming a gate line and a gate electrode;

forming a gate insulating film on the gate line and the gate electrode;

forming an active layer and an ohmic contact layer on the gate insulating film;

forming a data line, a source electrode and a drain electrode;

forming a protective film on the data line, the source electrode and the drain electrode;

forming a photo-resist pattern on the protective film, wherein the photo-resist pattern includes a contact hole to expose a portion of the drain electrode;

removing a portion of the photo-resist pattern over a display area using a first ashing process;

forming a transparent conductive film over the substrate;

forming an over-coat layer on the transparent conductive film;

removing the over-coat layer to expose the transparent conductive film over a non-display area using a second ashing process;

removing the exposed transparent conductive film to form a pixel electrode; and removing the remaining over-coat layer and the photo-resist pattern, wherein the transparent conductive film, which is formed at another area other than an area to be formed a conductive pattern including the pixel electrode is exposed to the exterior by carrying out the second ashing process regarding the over-coat layer, wherein the transparent conductive film, which is formed at a non-display area is exposed to the exterior by the second ashing process regarding the over-coat layer to form the conductive pattern.

* * * * *